(12) United States Patent
Okino et al.

(10) Patent No.: US 7,750,366 B2
(45) Date of Patent: Jul. 6, 2010

(54) SOLID-STATE IMAGING ELEMENT AND METHOD FOR MANUFACTURING THE SAME

(75) Inventors: Toru Okino, Toyama (JP); Mitsuyoshi Mori, Kyoto (JP)

(73) Assignee: Panasonic Corporation, Osaka (JP)

( * ) Notice: Subject to any disclaimer, the term of this patent is extended or adjusted under 35 U.S.C. 154(b) by 120 days.

(21) Appl. No.: 12/180,920

(22) Filed: Jul. 28, 2008

(65) Prior Publication Data

US 2009/0039387 A1 Feb. 12, 2009

(30) Foreign Application Priority Data

Aug. 10, 2007 (JP) ............................ 2007-208903

(51) Int. Cl.
H01L 31/0336 (2006.01)
H01L 31/109 (2006.01)
H01L 31/072 (2006.01)
H01L 31/0328 (2006.01)
H01L 31/113 (2006.01)
H01L 31/062 (2006.01)
H01L 21/324 (2006.01)

(52) U.S. Cl. .................. 257/184; 257/292; 257/291; 257/187; 257/E31.005; 257/E21.325

(58) Field of Classification Search .............. 257/184, 257/187, 291, 292, E31.005, E21.325
See application file for complete search history.

(56) References Cited

U.S. PATENT DOCUMENTS

| 7,364,933 B2* | 4/2008 | Kim ............................. 438/65 |
| 7,436,012 B2* | 10/2008 | Mori et al. .................. 257/292 |
| 2006/0061674 A1* | 3/2006 | Iida et al. .................... 348/308 |
| 2006/0183265 A1* | 8/2006 | Oh et al. ....................... 438/65 |
| 2008/0303058 A1* | 12/2008 | Mori et al. .................. 257/185 |

FOREIGN PATENT DOCUMENTS

| JP | 62-018075 | 1/1987 |
| JP | 11-289492 | 10/1999 |
| JP | 2005-175142 | 6/2005 |

OTHER PUBLICATIONS

Steinsland, E., et al., "Boron Etch-Stop in TMAH Solutions", The 8th International Conference on Solid-State Sensors and Actuators, and Eurosensors IX, Jun. 25-29, 1995, pp. 190-193, 40-PA 4, Stockholm, Sweden.

* cited by examiner

*Primary Examiner*—Luan C Thai
(74) *Attorney, Agent, or Firm*—McDermott Will & Emery LLP

(57) ABSTRACT

A solid-state imaging element includes a layered substrate made of silicon and composed of, for example, an N-type substrate, a P-type layer, and an N-type layer. In the layered substrate, an imaging region in which a plurality of pixels are arranged and a peripheral circuit region are formed. A recess reaching the reverse face of the P-type layer is formed in a reverse face portion of the layered substrate in the imaging region, and a reflective film is formed on at least the inner face of the recess. Light is reflected on the reverse face and the obverse face of the layered substrate.

11 Claims, 19 Drawing Sheets

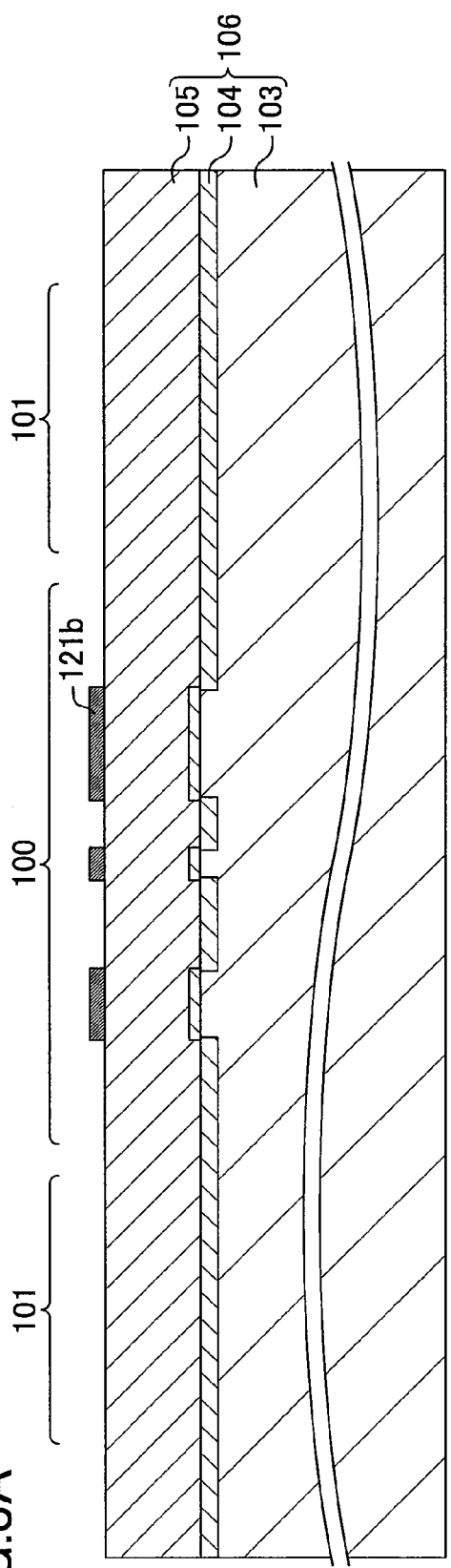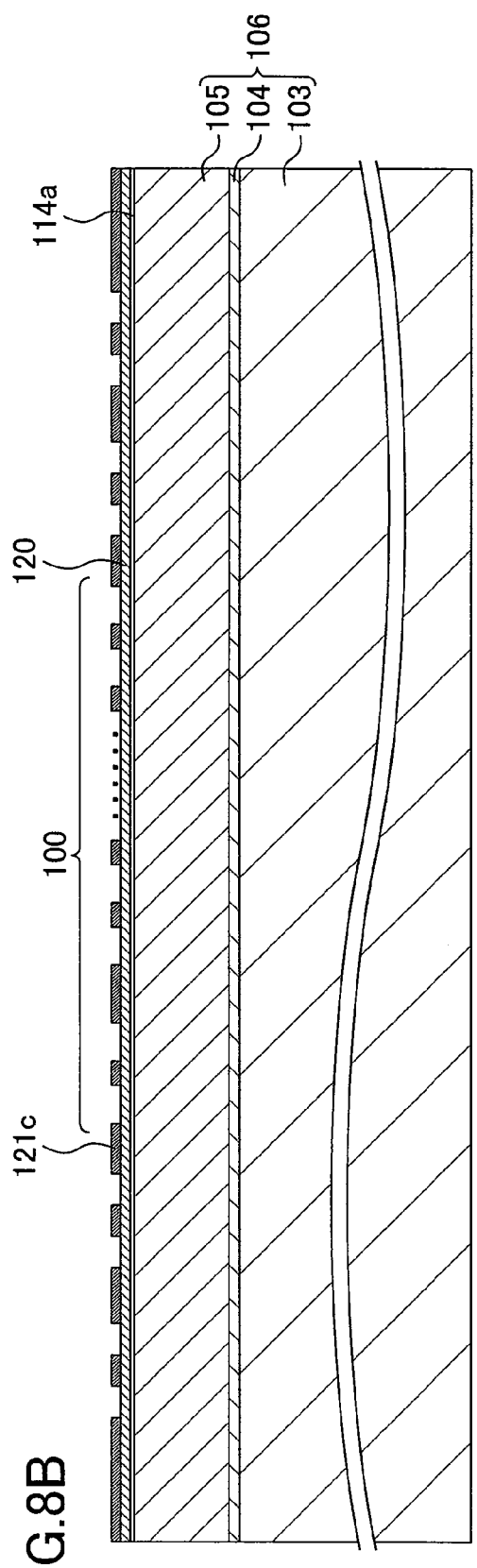

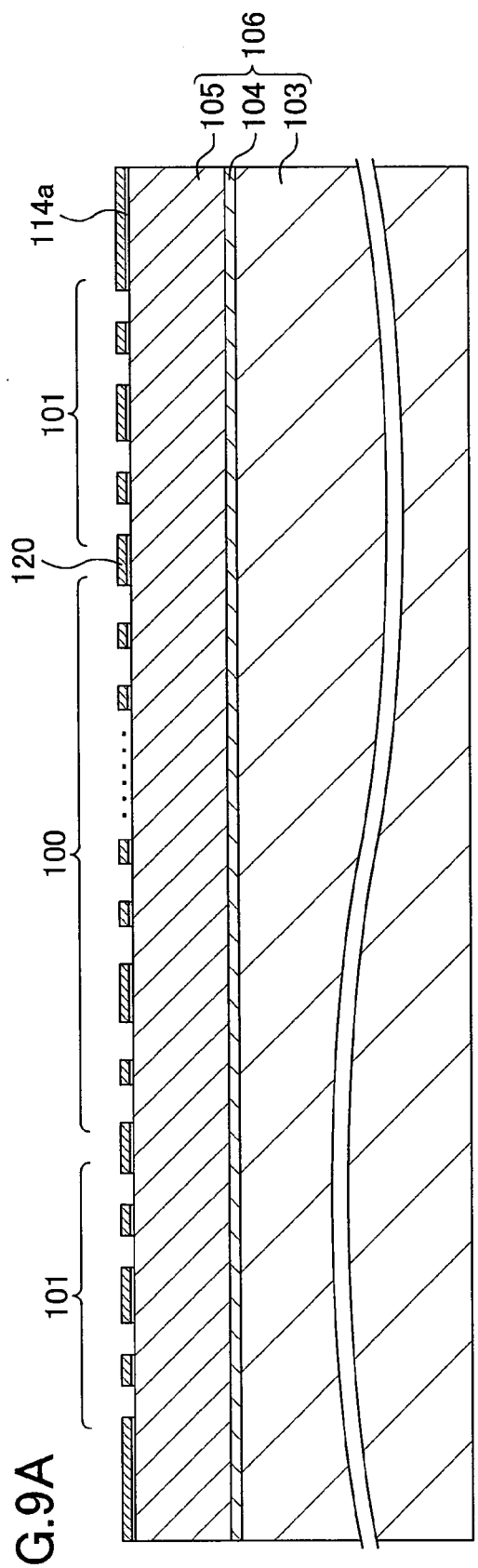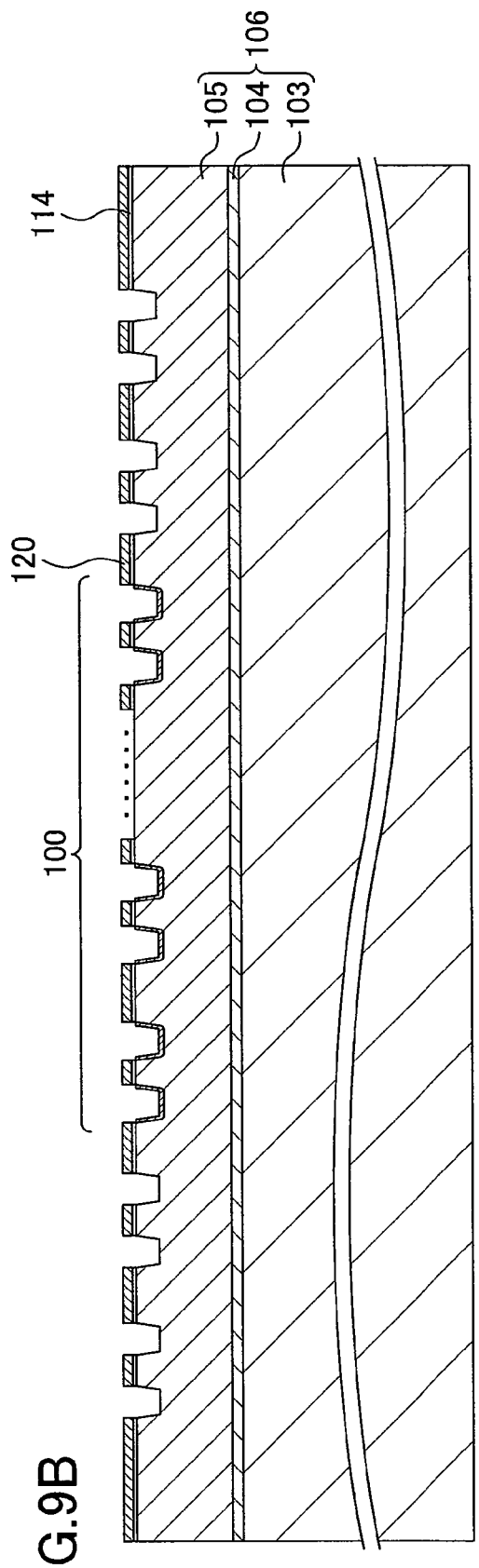

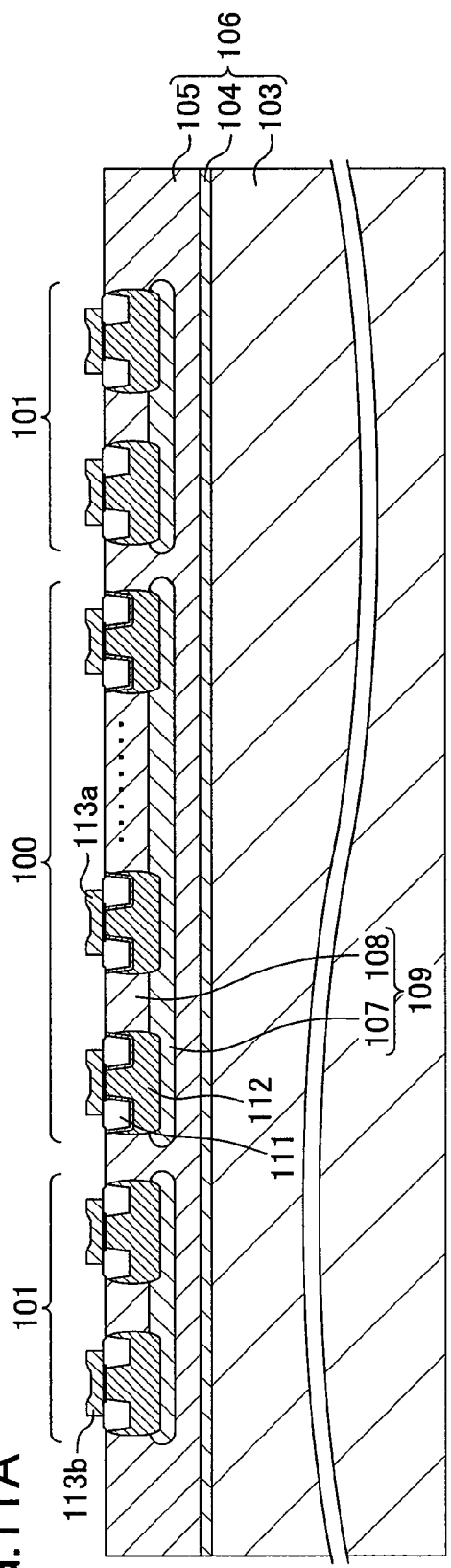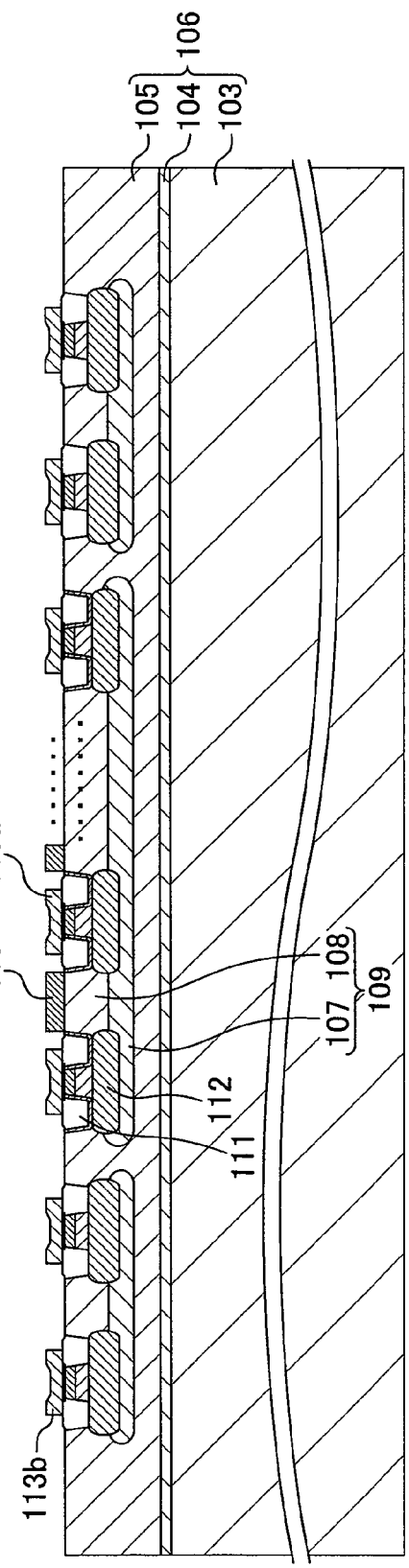

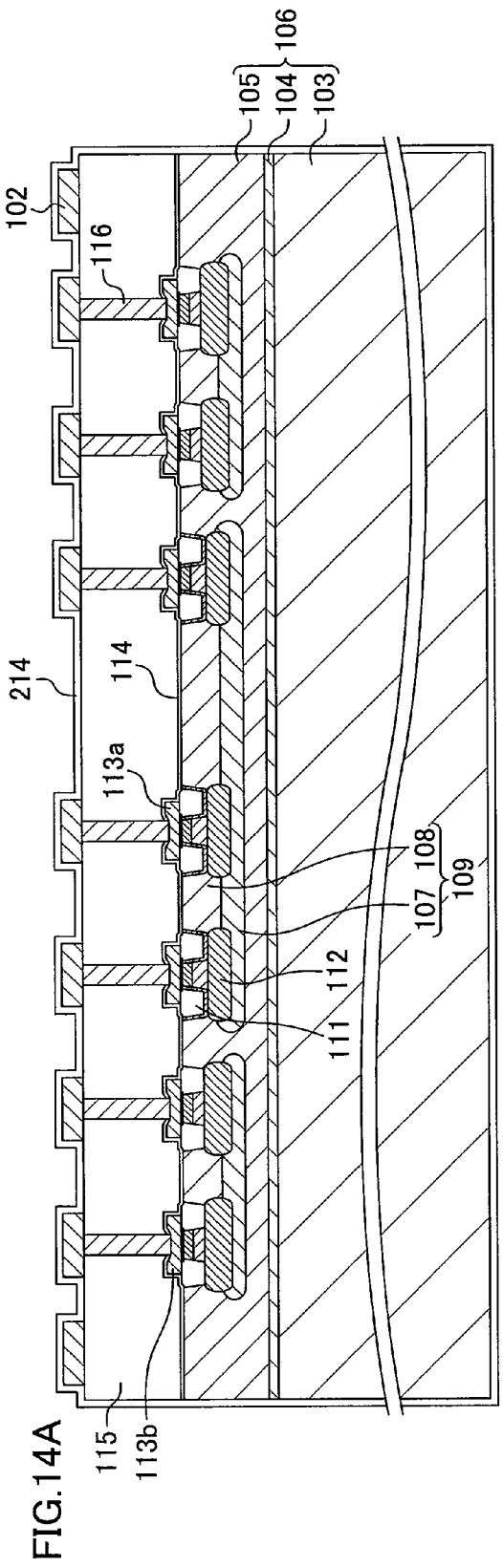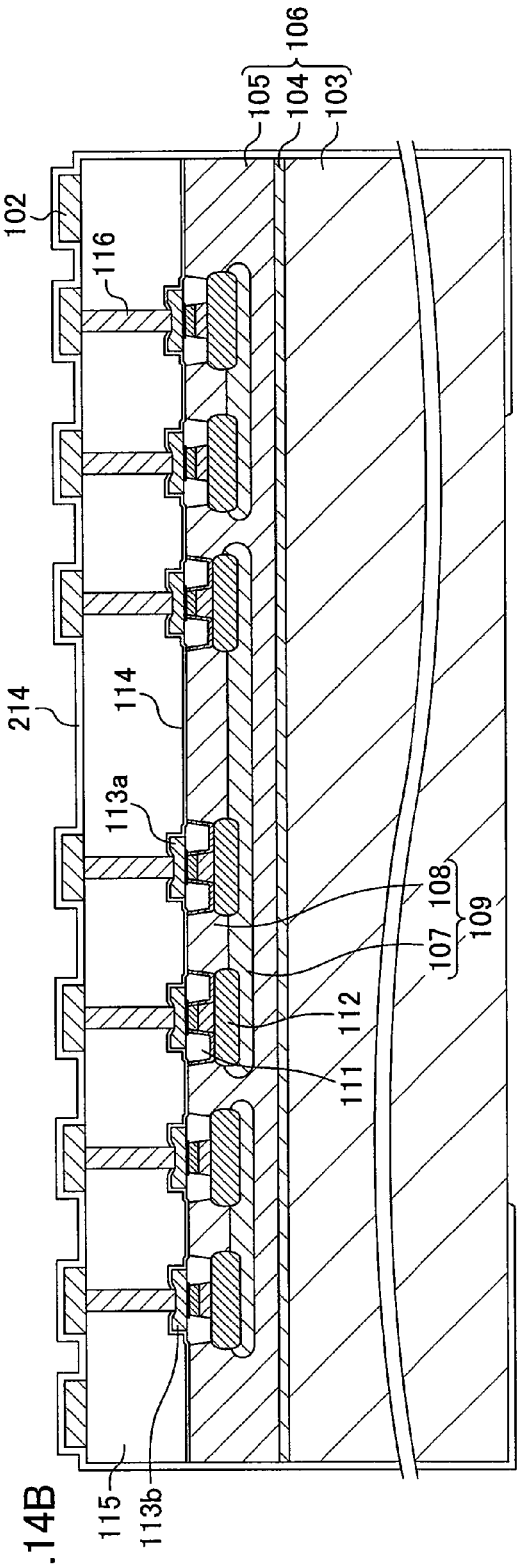

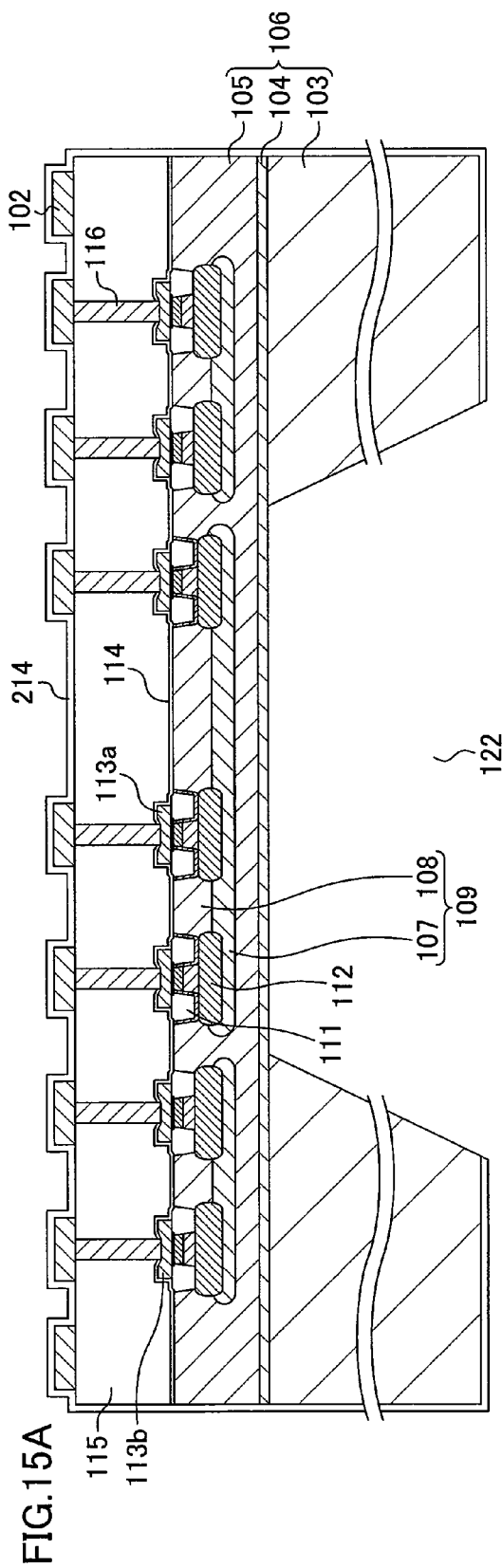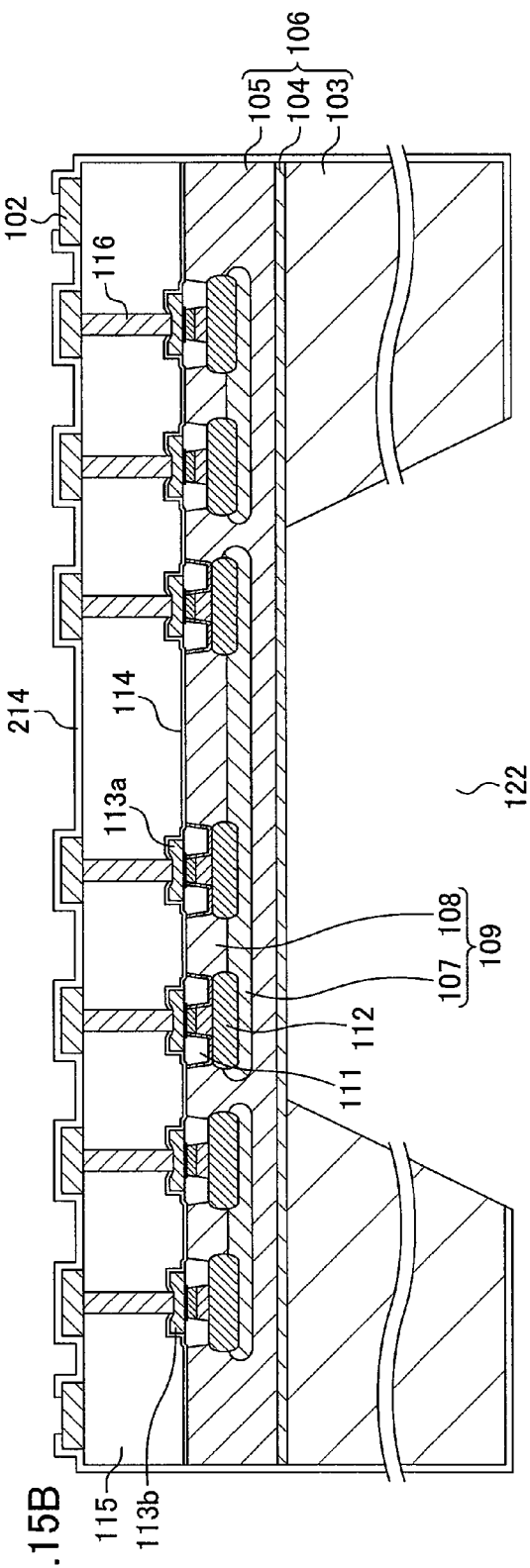

SOLID-STATE IMAGING ELEMENT AND METHOD FOR MANUFACTURING THE SAME

BACKGROUND OF THE INVENTION

1. Field of the Invention

The present invention relates to a resonance type solid-state imaging element including an imaging region in which a plurality of pixels are provided on a semiconductor substrate and a peripheral circuit region for driving the plurality of pixels and a method for manufacturing it.

2. Related Art

There is a demand for realization of MOS (Metal Oxide Semiconductor)-type solid-state imaging elements which bring cameras for night security, cameras boarded on safety driving assisting automobiles, and the like to have high sensitivity to, in addition to light in the visible region, light in the near-infrared region having a wavelength longer than that in the visible region. The MOS-type solid-state imaging elements are image sensors that read out signals accumulated in PN photodiodes forming pixels by using amplifier circuits included in MOS transistors and have features of being operated at low voltage and of being capable of high-speed reading and capable of being incorporated with peripheral circuits composed of MOS transistors in a single chip. However, silicon, which has been widely used as a semiconductor material for the solid-state imaging elements, hardly absorbs light having a wavelength exceeding approximately 1100 nm owing to its physical limit, and therefore, it is difficult to provide sensitivity to light having such a long wavelength to an image sensor using a silicon substrate. Further, image sensors using a silicon substrate have an optical absorption coefficient depending on the wavelength to have low sensitivity to light of which wavelength is in the near-infrared region exceeding 800 nm when compared with that to light of which wavelength is in the visible region. As a countermeasure against this problem, a resonance type light receiving device as a single light receiving element has been known which reflects light made incident from the obverse face of a substrate, on which the pixels are provided, on the reverse face thereof to increase the quantum efficiency, thereby increasing the sensitivity to longer-waveform light. As a conventional technique of this kind, Japanese Unexamined Patent Application Publication 2005-175142 will be referred to.

A substrate 1001 used in the conventional resonance type light receiving device is formed in such a fashion that the reverse face of a substrate on which elements are to be formed is joined to a silicon oxide film 1010 (forming a part) of another substrate, as shown in FIG. 18. Further, for efficient photoelectric conversion of incident light from the obverse face of the substrate, a recess 1122 is formed by etching a reverse face portion of the substrate 1001 in the light receiving region with the use of the silicon oxide film 1010 as a stopper layer. A reflective film 1117 mainly made of metal is formed on the reverse face of the substrate 1001. With this structure, the conventional resonance type single light receiving device utilizes the resonance effect that light made incident from the obverse face of the substrate is reflected on the reverse face thereof and the thus reflected light is further reflected on the obverse face thereof, thereby increasing the quantum efficiency.

In general, however, the substrates bonded to each other by means of the silicon oxide film (hereinafter referred to it as an SOI (Silicon on Insulator) substrate is higher in manufacturing cost and cost of the resultant product than an ordinary substrate made of only silicon (hereinafter referred to it as a silicon substrate).

SUMMARY OF THE INVENTION

The present invention has been made in view of the foregoing and has its object of providing a resonance type solid-state imaging element which has improved sensitivity to both light in the visible region and light in the near-infrared region with an increase in manufacturing cost suppressed.

To attain the above object, a solid-state imaging element in accordance with the present invention is a solid-state imaging element in which an imaging region in which a plurality of pixels each including a photoelectric converter and a transistor are provided and a peripheral circuit region are formed, which includes: a substrate including a silicon substrate and a first semiconductor substrate containing a P-type impurity at a concentration higher than that in the silicon substrate and having an obverse face on which the plurality of pixels are provided and a reverse face portion, wherein a recess reaching the reverse face of the first semiconductor layer is formed in the reverse face portion of the substrate in the imaging region.

With the above arrangement, a resonance type solid-state imaging element can be formed without using an expensive SOI substrate. Accordingly, light is reflected on the reverse face of the first semiconductor layer and the obverse face of the substrate to increase the light amount that is to be converted to charges by the photoelectric converter, thereby improving the sensitivity to visible light and near infrared light. Formation of a reflective film on the inner face of the recess leads to a further increase in amount of the reflected light.

A method for manufacturing a solid-state imaging element in accordance with the present invention is a method for manufacturing a solid-state imaging element in which an imaging region and a peripheral circuit region are formed, which includes the steps of: (a) preparing a substrate including: a silicon substrate; a first semiconductor layer formed on the silicon substrate and containing one conductivity type impurity at a concentration higher than that of the silicon substrate; and a second semiconductor layer provided on the first semiconductor layer; (b) forming, in the imaging region, pixels each including a photoelectric converter in the second semiconductor layer and a transistor on the second semiconductor layer; and (c) forming a recess reaching the reverse face of the first semiconductor layer in the imaging region by etching a reverse face portion of the substrate with the use of the first semiconductor layer as a stopper.

When the substrate including the first semiconductor substrate containing, for example, a P-type impurity at a high concentration is prepared, the recess can be formed in the reverse face portion of the substrate in the imaging region by etching using the first semiconductor layer as an etching stopper. This leads to easy manufacture of a resonance type solid-state imaging element having high sensitivity at low cost without using a SOI substrate.

Thus, in the present invention, the first semiconductor layer containing a P-type impurity at a concentration higher than the silicon substrate is formed on the silicon substrate. Accordingly, the first semiconductor layer can be used as an etching stopper in etching for forming the recess in the reverse face portion of the substrate in the imaging region, with a result that a resonance type solid-state imaging element having high sensitivity can be manufactured without using an expensive SOI substrate.

BRIEF DESCRIPTION OF THE DRAWINGS

FIGS. 8A and 8B are sectional views showing the solid-state imaging element manufacturing method in accordance with the present invention.

FIGS. 9A and 9B are sectional views showing the solid-state imaging element manufacturing method in accordance with the present invention.

FIGS. 11A and 11B are sectional views showing the solid-state imaging element manufacturing method in accordance with the present invention.

FIGS. 14A and 14B are sectional views showing the solid-state imaging element manufacturing method in accordance with the present invention.

FIGS. 15A and 15B are sectional views showing the solid-state imaging element manufacturing method in accordance with the present invention.

DETAILED DESCRIPTION OF PREFERRED EMBODIMENTS

Structures of resonance type solid-state imaging elements and manufacturing methods thereof in accordance with embodiments of the present invention will be described below with reference to the accompanying drawings.

Embodiment 1

Figure 1:
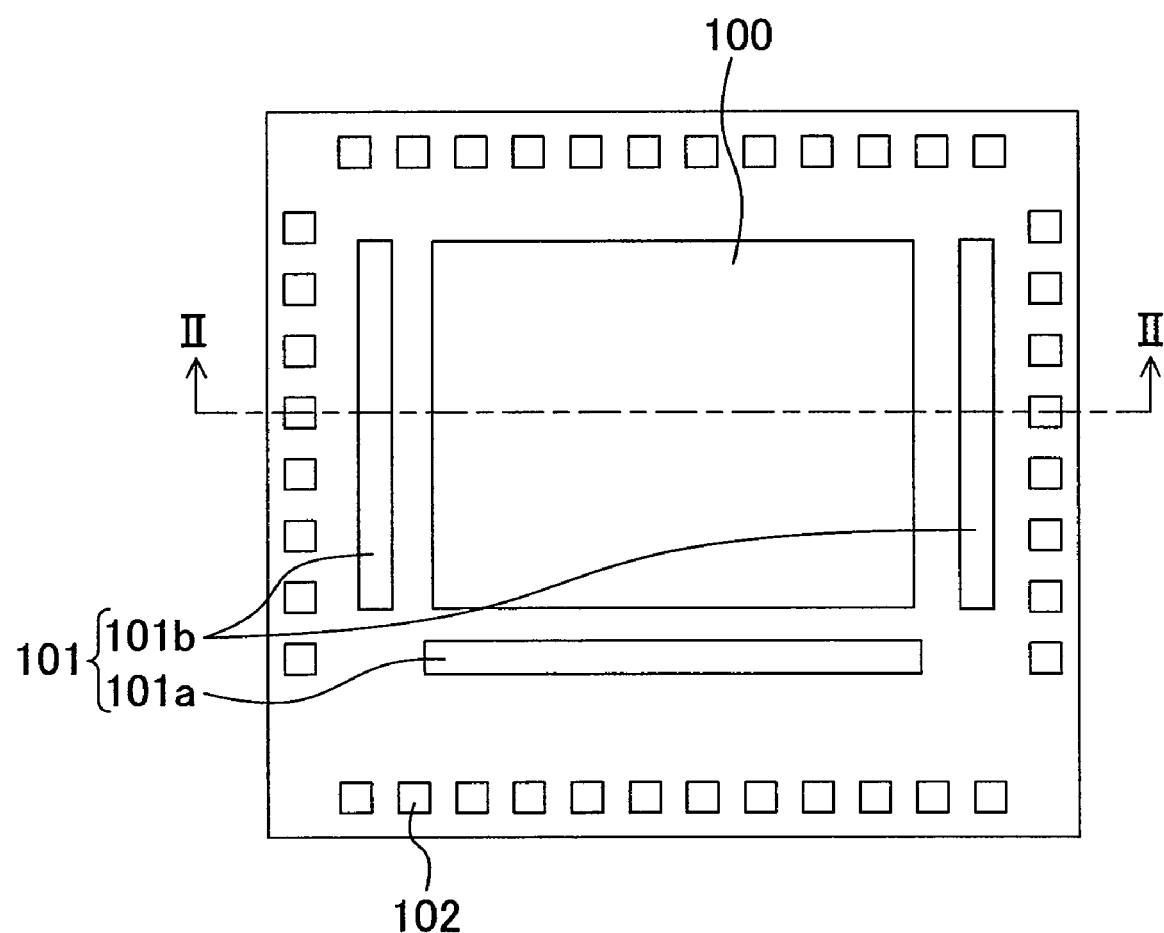
FIG. 1 is a schematic plan view for explaining an overall structure of a resonance type solid-imaging element in accordance with Embodiment 1 of the present invention.

FIG. 1 is a schematic plan view for explaining an overall structure of a resonance type solid-imaging element in accordance with Embodiment 1 of the present invention. FIG. 1 is a view as viewed from the obverse face side of a substrate (a face where semiconductor elements are formed).

As shown in FIG. 1, the solid-state imaging element of the present embodiment includes an imaging region 100 and a peripheral circuit region 101. In the imaging region 100, a plurality of pixels for photoelectric conversion are arranged in matrix. The peripheral circuit region 101 is arranged around the imaging region 100 and includes various circuits relating to signal reading, such as a vertical shift resistor 101b for selecting a pixel from which a signal is to be read out, a horizontal shift resistor 101a for outputting a signal read out from a pixel to the outside of the solid-state imaging element, and the like.

Bonding pads 102 made of metal, such as aluminum, aluminum alloy, or the like are arranged outside of the peripheral circuit region 101, namely, along the periphery of the substrate. The substrate shown in FIG. 1 is in a rectangular shape in plan, and the bonding pads 102 are arranged in a row along each side of the rectangle.

A signal read out through the vertical shift resistor 101b and the horizontal shift resistor 101a is sent to a corresponding bonding pad 102 and is output outside the solid-state imaging element. Details of the structures of MOS transistors and wirings provided in each regions are not shown in FIG. 1.

Figure 2:
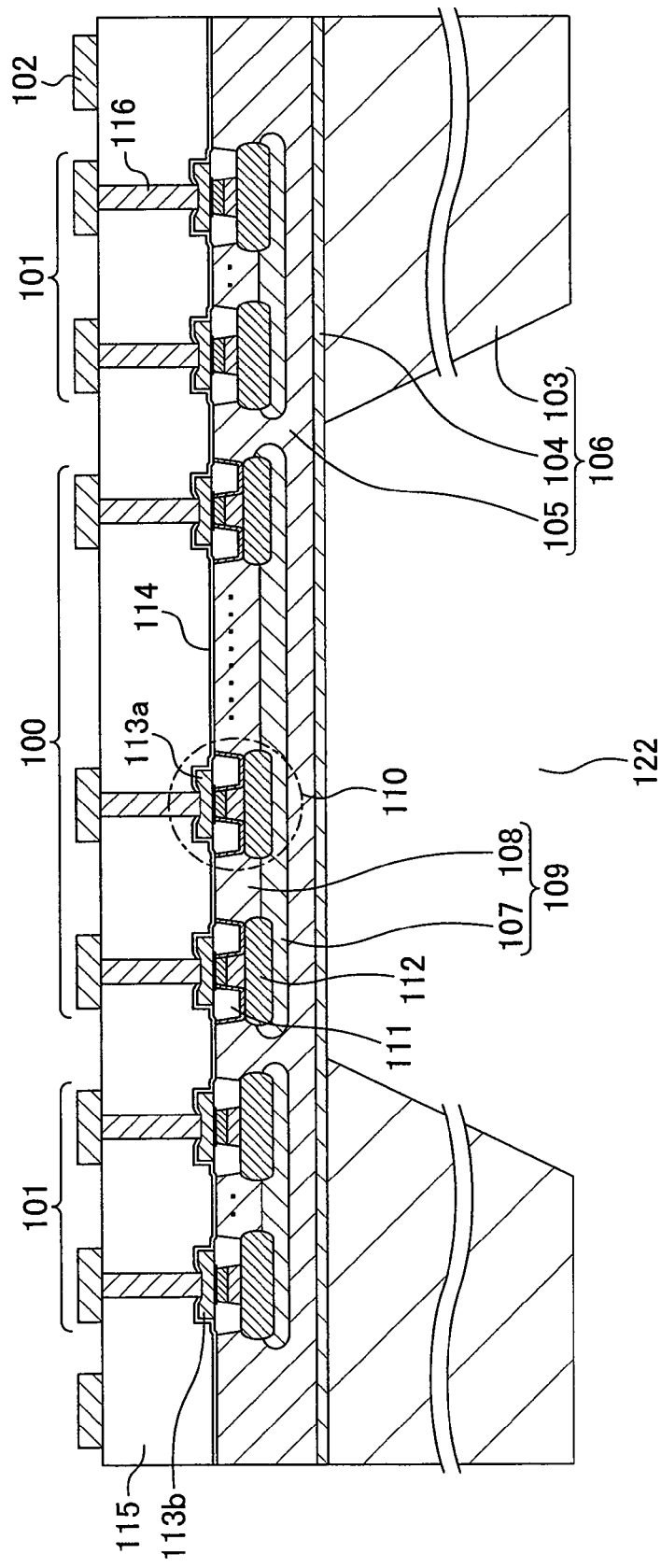
FIG. 2 is a sectional view taken along the line II-II in FIG. 1 which shows an example of a structure of the solid-state imaging element in accordance with Embodiment 1.

FIG. 2 is a sectional view taken along the line II-II in FIG. 1 which shows an example of a structure of the solid-state imaging element in accordance with Embodiment 1. As shown in FIG. 2, the solid-state imaging element of Embodiment 1 includes an NP$^+$N type layered substrate 106 in a layered structure of an N-type silicon substrate 103, a P$^+$-type layer (a first semiconductor layer) 104 epitaxially grown on the N-type silicon substrate 103 and containing a P-type impurity at a high concentration, and an N-type layer (a second semiconductor layer) 105 epitaxially grown on the P$^+$-type layer 104 and containing an N-type impurity at a low concentration. The conductivity type of the silicon substrate 103 is set to be N type herein, but any effects in the present invention are not lost even if the conductivity type is set to be P-type as long as it is at a low concentration. The impurity concentration of the P$^+$-type layer 104 is higher than that of the N-type silicon substrate 103. In the imaging region 100 of the solid-state imaging element of the present invention, the pixels are arranged in matrix. Each of the pixels includes a reset transistor 110, a transfer transistor (not shown), and an amplifier transistor (not shown), which are provided on the N-type layer 105 (the layered substrate 106), and a PN photodiode (a photoelectric converter) 109, which is provided in the N-type layer 105.

The PN photodiode 109 has a function of converting incident light to charges and includes a part of a P-type impurity layer 107 and an N-type impurity layer 108 formed on the P-type impurity layer 107. The MOS transistors, such as the reset transistor 110 and the like are provided above a P-type channel stop layer 112 provided on the P-type impurity layer 107 and each include an impurity diffusion region (source/drain; not shown) provided in the upper part of the N-type layer 105 and a gate insulting film and a gate electrode 113a provided on the N-type layer 105. The PN photodiode 109 and each transistor are electrically separated by an isolation region 111. In the imaging region 100, the isolation region 111 is covered with a thin P-type layer.

Referring to the peripheral circuit region 101, as described above, the vertical shift resistor 101b and the horizontal shift resistor 101a are provided for transferring the charges photo-electrically converted by the PN photodiodes 109 from a pixel to a bonding pad 102. These shift resistors are provided above the channel stop layer 112 on the P-type impurity layer 107 and are each composed of a MOS transistor including an impurity diffusion layer (not shown) formed in the upper part of the N-type layer 105 and a gate insulating film and a gate electrode 113b provided on the N-type layer 105.

In the imaging region 100, a recess 122 is formed in the N-type silicon substrate 103 of the layered substrate 106 by etching a reverse face portion of the substrate 103 so that the thickness of the layered substrate 106 is in the range between 5 μm and 8 μm, both inclusive. In the solid-state imaging element of the present embodiment, the reverse face of the P$^+$-type layer 104 is exposed in the imaging region 100. In the example shown in FIG. 2, the recess 122 is in a tapered shape of which inner diameter is increased as it goes downward. Alternatively, the inner wall of the recess 122 may be almost perpendicular to the reverse face of the substrate 103. For example, the thickness of the P$^+$-type layer 104 is set in the range between approximately 0.1 μm and 1 μm, both inclusive, and the thickness of the N-type layer 105 is set in the range between approximately 5 μm and 7 μm, both inclusive. This setting is preferable in increasing the sensitivity to both light in the visible light region and light in the near infrared region.

The higher the concentration of the P-type impurity contained in the P$^+$-type layer 104 is, the higher the etching selectivity to the N-type silicon substrate 103 is. Accordingly, the P$^+$-type layer 104 can be reduced in thickness.

On the entirety of the obverse face of the layered substrate 106, a silicon oxide film 114 is formed dominantly for protecting the imaging region 100. An interlayer insulating film 115 is formed on the silicon oxide film 114. Wirings are formed on the interlayer insluting film 115 in the imaging region 100 and the peripheral circuit region 101, and the bonding pads 102 are provided on the peripheral part of the interlayer insulating film 115. Contact plugs are formed so as to pass through the interlayer insulating film 115 for connecting the gate electrodes 113a, 113b and the wirings provided thereabove.

Figure 19:
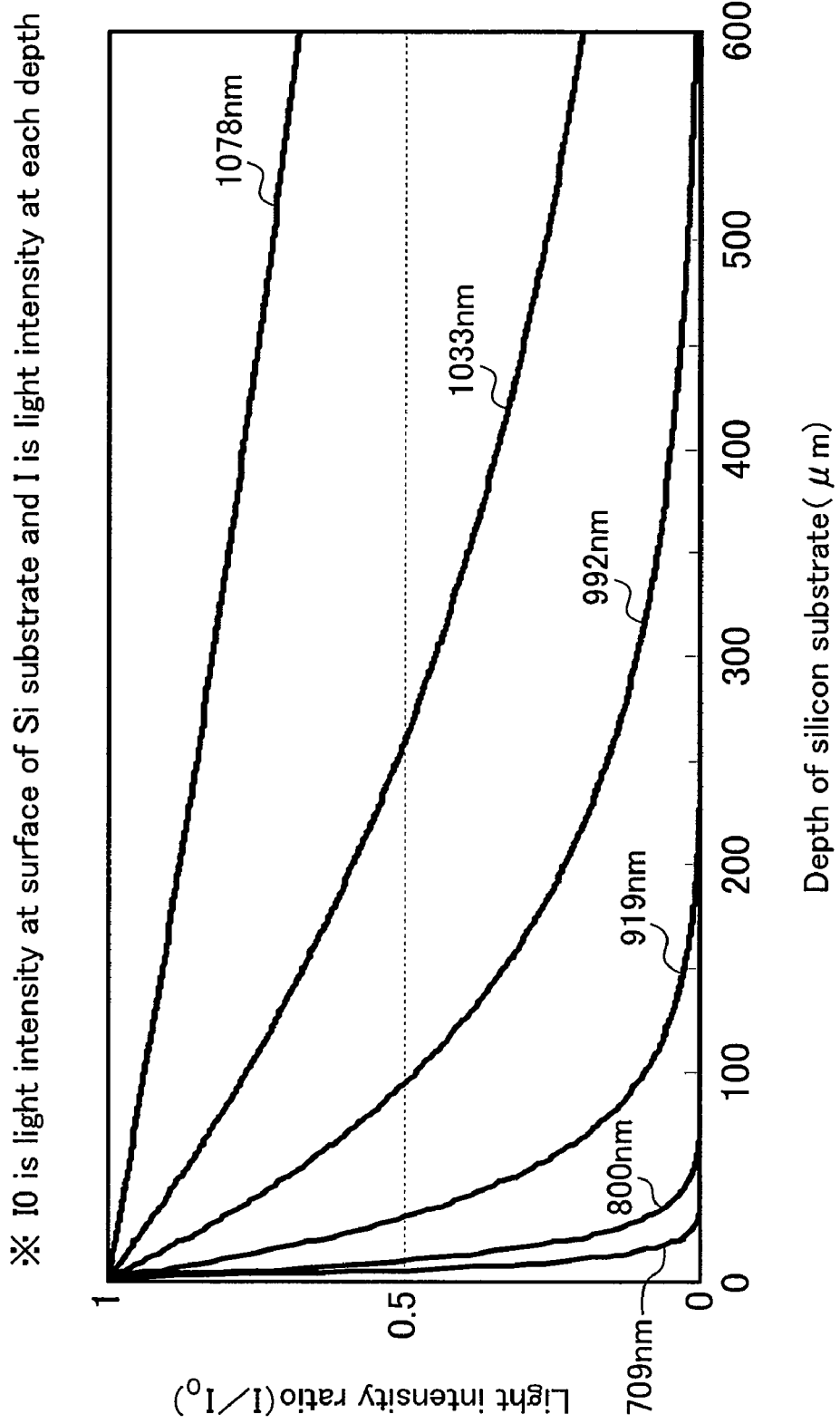
FIG. 19 is a graph showing absorption of lights having wavelengths in a silicon substrate.

The most significant feature of the above described solid-state imaging element of the present embodiment lies in that the recess 122 is formed in the reverse face portion of the layered substrate 106 formed of the silicon layers layered of which conductivities are different from each other. Lights made incident from the obverse face of the layered substrate 106 are photo-electrically converted by the PN photodiode 109. Of the lights, light having a long wavelength is not absorbed and reaches a deep part of the substrate, as shown in FIG. 19. FIG. 19 is a graph showing absorption of lights having different wavelengths in a silicon substrate.

In the solid-state imaging element of the present embodiment, the recess 122 is formed, so that of the lights reaching the reverse face of the layered substrate 106 (the reverse face of the P$^+$-type layer 104), approximately 35% lights are reflected owing to the difference in refractive index between the silicon and the space of the recess 122 and passes through the PN photodiode 109 again. Hence, the quantum efficiency and the sensitivity are increased. Herein, the layered substrate 106 is made of a single composition of silicon, and the recess 122 is formed by etching the reverse face portion of the substrate with the use of the P$^+$-type layer 104 containing the impurity at a high concentration as a stopper. This attains a low-cost solid-state imaging element exhibiting increased sensitivity to light having a long wavelength when compared with the case using a conventional expensive SOI substrate.

Further, the silicon oxide film 114 is formed on the PN photodiode 109 in the solid-state imaging element of the present embodiment, so that approximately 20% lights out of lights reflected on the reverse face of the layered substrate 106 are reflected again on the obverse face of the layered substrate 106 to be photo-electrically converted by the PN photodiode 109. This further improves the sensitivity.

Supposing that the light intensity at the obverse face of a silicon substrate is $I_0$ and that at each depth is I, FIG. 19 proves that the light having a long wavelength reaches a deep part of the silicon substrate without being absorbed. When it is assumed that the reflectance at the reverse face of the substrate 106 is 100%, incident light passes through the PN photodiode 109 twice where the thickness of the N-type layer (epitaxial layer) 105 is 100 μm, which means an increase in sensitivity.

It is understood from FIG. 19 that the sensitivity of the solid-state imaging element of the present invention can be improved significantly to light having a wavelength of approximately 900 nm or longer. This is because: while light having a wavelength of 900 nm or longer is absorbed insufficiently if it is not resonated within the layered substrate 106, the absorption amount of light is increased greatly as a whole in the solid-state imaging element of the present invention.

Preferably, the thickness of the semiconductor layer composing the solid-state imaging element of the present embodiment is thin in the light receiving part as far as possible within a range that the PN photodiode 109 can be formed. The reflectances of lights having any wavelengths on the reverse face of the layered substrate 106 are almost equivalent to each other, and therefore, a thin semiconductor layer allows the wavelength region of light that can reach the reverse face of the layered substrate 106 to be widened on the short-wavelength side.

In the case where the part of the layered substrate 106 in which the recess 122 is formed has a thickness of 5 μm, the sensitivity to light having a wavelength of approximately 600 nm or longer is increased. Thus, the sensitivity to visible light and near infrared light is improved in the solid-state imaging element of the present invention though the wavelength range of light to which the sensitivity can be improved depends on the thickness of the part of the layered substrate 106 in which the recess 122 is formed.

Further, in the solid-state imaging element of the present embodiment, only the thickness of the layered substrate 106 in the imaging region 100 is set thinner than the other region so that the layered substrate 106 has a sufficient thickness in the peripheral circuit region 101, thereby maintaining the strength of the wafer.

With the P$^+$-type layer 104 having a high peak concentration in the range between $1\times10^{18}$ atoms/cm$^3$ and $1\times10^{21}$ atoms/cm$^3$, both inclusive, etching can be performed on the N-type silicon substrate 103 for forming the recess 122 with the use of the P$^+$-type layer 104 as an etching stopper. The P$^+$-type layer 104 may be formed in a rectangular shape by epitaxial growth by CVD (Chemical Vapor Deposition) or the like or may be formed in a mountain-like shape by ion implantation. Formation of the P$^+$-type layer 104 by ion implantation allows easy setting of the depth and the location of the peak point of the P$^+$-type layer 104. Accordingly, the peak point of the impurity concentration in the region where the PN photodiode 109 is formed can be located shallower than that of the impurity concentration in the region where the (MOS) transistors are formed. In other words, the thickness of the region of the layered substrate 106 in which the MOS transistors are formed can be increased while the thickness of the region of the layered substrate 106 in which the PN photodiode 109 is formed can be increased in the imaging region 100, thereby further increasing the strength of the wafer. The recess 122 is formed in the reverse face portion of the layered substrate 106 for improving the sensitivity to light having a short wavelength, which is readily absorbed in silicon, by causing the light having a short wavelength to be reflected sufficiently on the reverse face of the layered substrate 106.

When a substrate contact part capable of controlling the potential of the N-type layer 105 is formed on the obverse face of the layered substrate 106 in the resonance type solid-state imaging element of the present invention, the charges photoelectrically converted in the N-type layer 105 below the PN photodiode 109 in the imaging region 100, which may serve as a factor of color mixture, can be recovered through the substrate contact part. In addition, when a P-type silicon germanium layer is formed by epitaxial growth on the N-type layer 105 in the imaging region 100, the quantum efficiency increases because the silicon germanium absorbs light having a wavelength of 1100 nm or longer, which silicon hardly absorbs, and has a light absorption coefficient higher than silicon. Hence, a resonance type solid-state imaging element exhibiting high sensitivity to light having a long wavelength can be realized.

Embodiment 2

Figure 3:
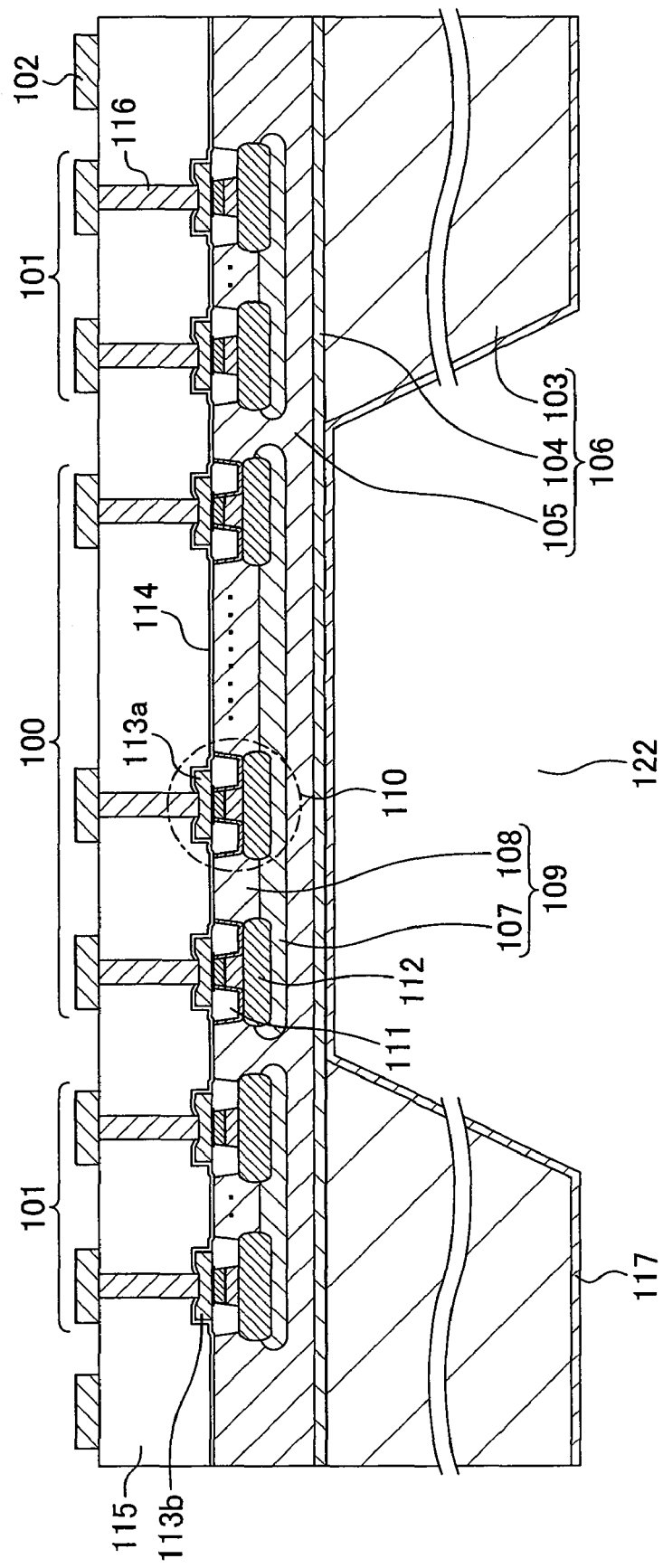
FIG. 3 is a sectional view showing an example of a structure of a solid-state imaging element in accordance with Embodiment 2.

FIG. 3 is a sectional view showing an example of a structure of a solid-state imaging element in accordance with Embodiment 2. FIG. 3 shows a section of the same part as that taken along the line II-II in FIG. 1.

The solid-state imaging element of the present embodiment is a solid-state imaging element of Embodiment 1 which further includes a reflective film 117 on the reverse face of the layered substrate 106 for covering at least the recess 122. The reflective film 117 has a thickness of 1 μm or greater.

Preferably, the reflective film 117 is made of metal having a high reflectance, such as Au, Ag, Al or the like. Alternatively, the reflective film 117 may be made of a dielectric material or an organic material rather than metal having a high reflectance, which can attain the same effects as those in the present invention. The dielectric material includes $SiO_2$, $TiO_2$, and the like.

The reflective film 117 made of a metal material, a dielectric material, or an organic material having a high reflectance is formed on the reverse face in the recess 122 of the layered substrate 106 to increase the reflectance, thereby resulting in improvement of the sensitivity to light in a wide wavelength band when compared with that in the solid-state imaging element of Embodiment 1. Even if the silicon substrate is increased in thickness for increasing light having a wavelength longer than a given wavelength, the PN photodiode 109 can exhibit high sensitivity owing to the presence of the reverse face of the substrate having the high reflectance, with a result that an effect of maintaining the mechanical strength of the element is obtained in addition.

The reflective film 117 is formed to cover only the recess 122 or may be formed on a part of the reverse face of the layered substrate 106, or be formed on the entirety of the reverse face thereof.

Embodiment 3

Figure 4:
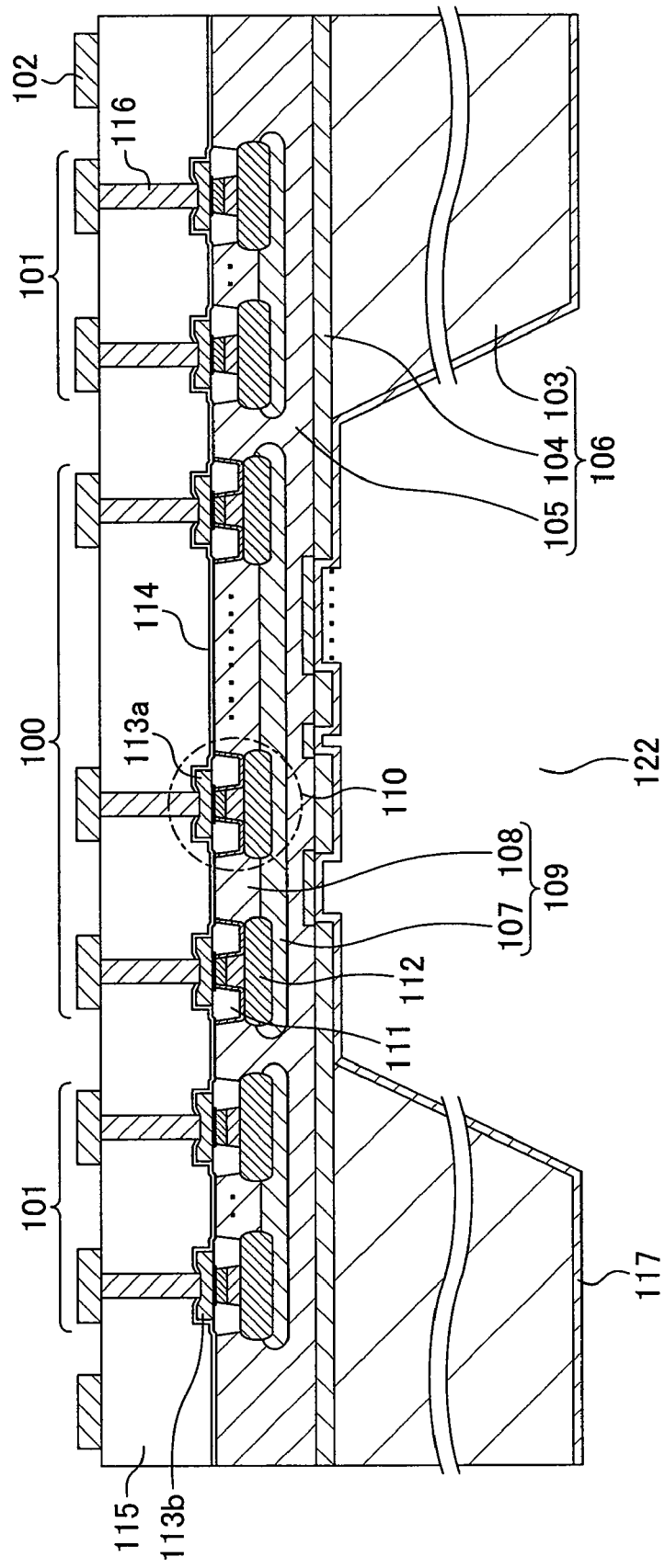
FIG. 4 is a sectional view showing an example of a structure of a solid-state imaging element in accordance with Embodiment 3.

FIG. 4 is a sectional view showing an example of a structure of a solid-state imaging element in accordance with Embodiment 3. In the solid-state imaging element of the present embodiment, as shown in FIG. 4, the $P^+$-type layer 104 at a high concentration is formed by ion implantation rather than epitaxial growth so as to form a peak point of the P-type impurity where the layered substrate 106 is thinned in the imaging region 100. Specifically, the peak point in the $P^+$-type layer 104 under the PN photodiode 109 is located shallower than that in the $P^+$-type layer 104 under the MOS transistors other than the PN photodiode 109 in the imaging region 100.

Since the $P^+$-type layer 104 is used as an etching stopper in etching the reverse face portion of the substrate for forming the recess 122, the thickness of the layered substrate 106 in the MOS transistor formation region above the recess 122 where the layered substrate 106 is thinned can be set greater than that in the PN photodiode 109 formation region thereabove, thereby securing the strength of the solid-state imaging element. With the layered substrate 106 thinned in the PN photodiode 109 formation region, color mixture in pixels adjacent to each other is prevented from being caused under the PN photodiode 109. Herein, formation of the $P^+$-type layer 104 by ion implantation increases the strength when compared with the case where the $P^+$-type layer 104 having the same thickness is formed by epitaxial growth, thereby leading to attainment of further reduction in thickness of $P^+$-type layer 104.

Formation of the $P^+$-type layer 104 containing a P-type impurity at a high concentration by ion implantation facilitates control of the depth and the range of the $P^+$-type layer 104. This permits the impurity concentration and the range of the $P^+$-type layer 104 under the PN photodiode 109 to be set so as to improve the sensitivity to light having a predetermined or longer wavelength.

Embodiment 4

Figure 5:
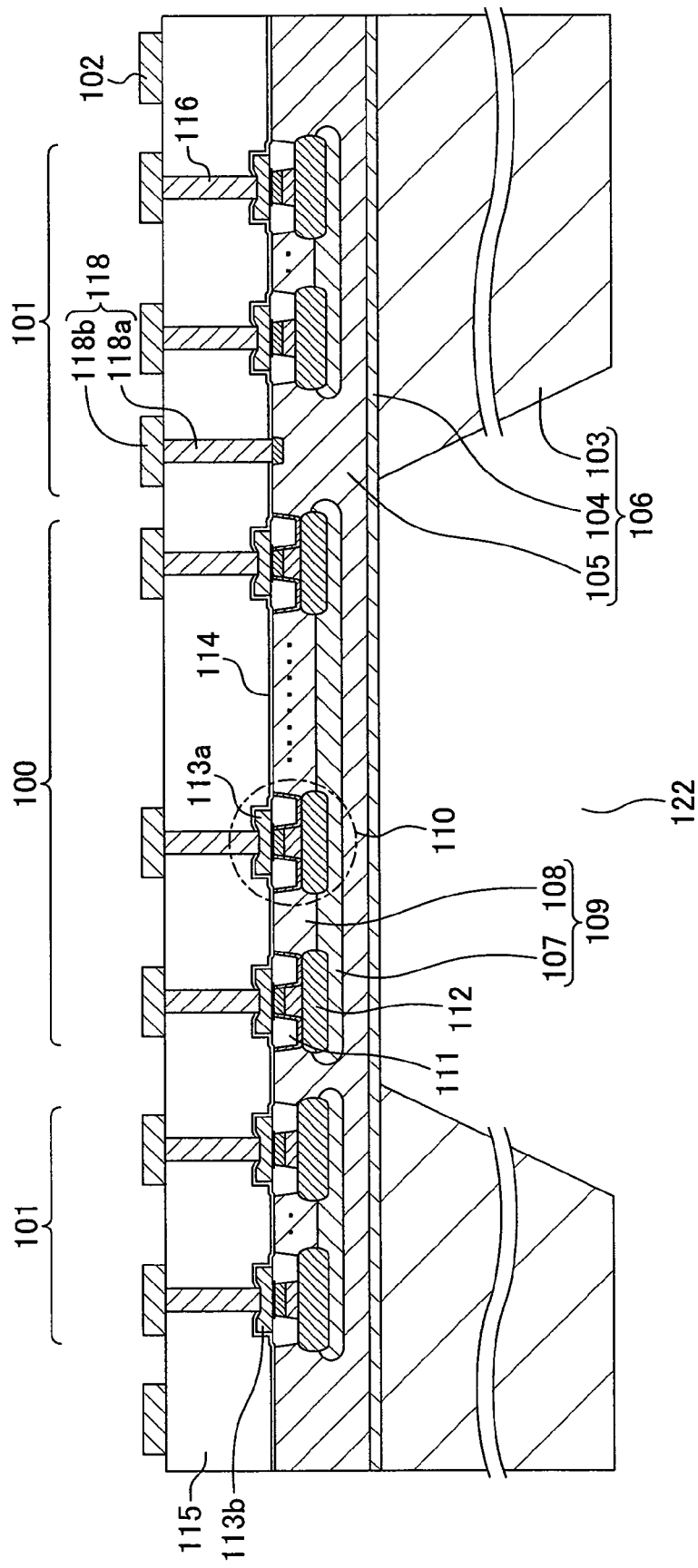
FIG. 5 is a sectional view showing an example of a structure of a solid-state imaging element in accordance with Embodiment 4.

FIG. 5 is a sectional view showing an example of a structure of a solid-state imaging element in accordance with Embodiment 4.

The solid-state imaging element of the present embodiment includes, in addition to the structure of the solid-state imaging element in accordance with Embodiment 1, a substrate contact part 118 composed of a substrate contact 118a and a pad (contact pad) 118b in the peripheral circuit region 101. The substrate contact 118a as a contact plug passes through the interlayer insulating film 115 and is formed on the obverse face of the N-type layer 105. The pad 118b is connected to the contact plug and is formed on the interlayer insulating film 115.

In the solid-state imaging element of the present embodiment, the substrate contact part 118 formed of the substrate contact 118a and the pad 118b is connected to the N-type layer 105, thereby being capable of controlling the potential of a part of the N-type layer 105 which is located below the PN photodiode 109. Accordingly, charges not contributing to signals of the PN photodiode 109, which cause color mixture (crosstalk), out of the charges photo-electrically converted in the N-type layer 105 in the imaging region 100 can be recovered to suppress color mixture.

Embodiment 5

Figure 6:
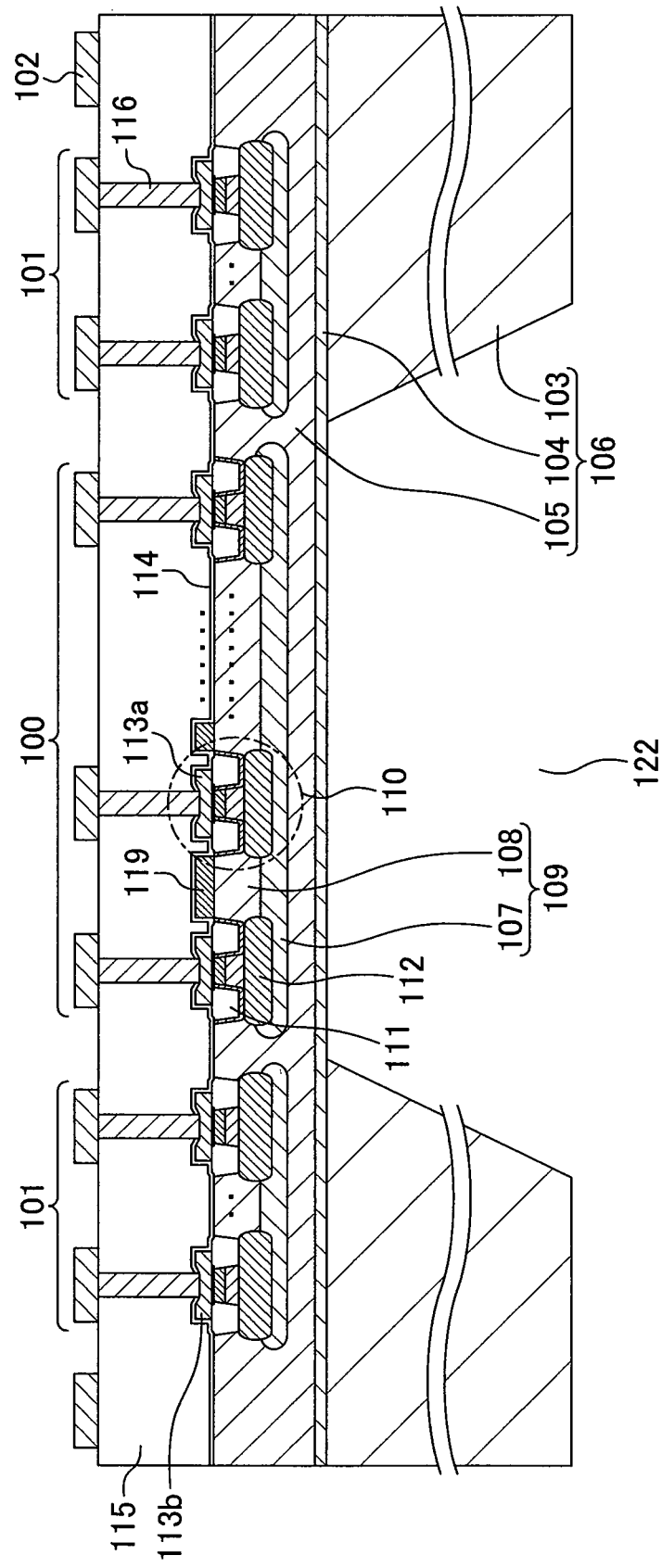
FIG. 6 is a sectional view showing an example of a structure of a solid-state imaging element in accordance with Embodiment 5.

FIG. 6 is a sectional view showing an example of a structure of a solid-state imaging element in accordance with Embodiment 5.

The solid-state imaging element of the present embodiment includes, in addition to the structure of the solid-state imaging element of Embodiment 1, a P-type silicon germanium layer 119 is formed by epitaxial growth on the N-type impurity layer 108 in the imaging region 100. The silicon germanium layer 119 contains a P-type impurity at a concentration in the range between, for example, approximately $1 \times 10^{14}$ atoms/cm$^3$ and $1 \times 10^{17}$ atoms/cm$^3$. The composition ratio of germanium x in the silicon germanium layer 119 is in the range of 0<x<1.

Silicon germanium has an absorption coefficient greater than silicon and absorbs also light having a wavelength of approximately 1100 nm or longer, which silicon hardly absorbs. Hence, formation of the P-type silicon germanium layer 119 on the PN photodiode 109 enables absorption of light having a wavelength of approximately 1100 nm or longer, of which absorption by silicon is difficult, thereby improving the sensitivity to light having a longer wavelength.

Further, light made incident from the obverse face of the layered substrate 106 is reflected on the reverse face of the layered substrate 106 to increase further the sensitivity of the solid-state imaging element, thereby increasing the quantum efficiency.

Embodiment 6

FIGS. 7A, 7B, 8A, 8B, 9A, 9B, 10A, 10B, 11A, 11B, 12A, 12B, and 13 are sectional views showing a solid-state imaging element manufacturing method in accordance with the present invention. With reference to the drawings, the solid-state imaging element manufacturing method in accordance with the present invention will be described as Embodiment 6. For easy understanding, the method is mainly directed to formation of the solid-state imaging element of Embodiment 1.

Figure 7A:
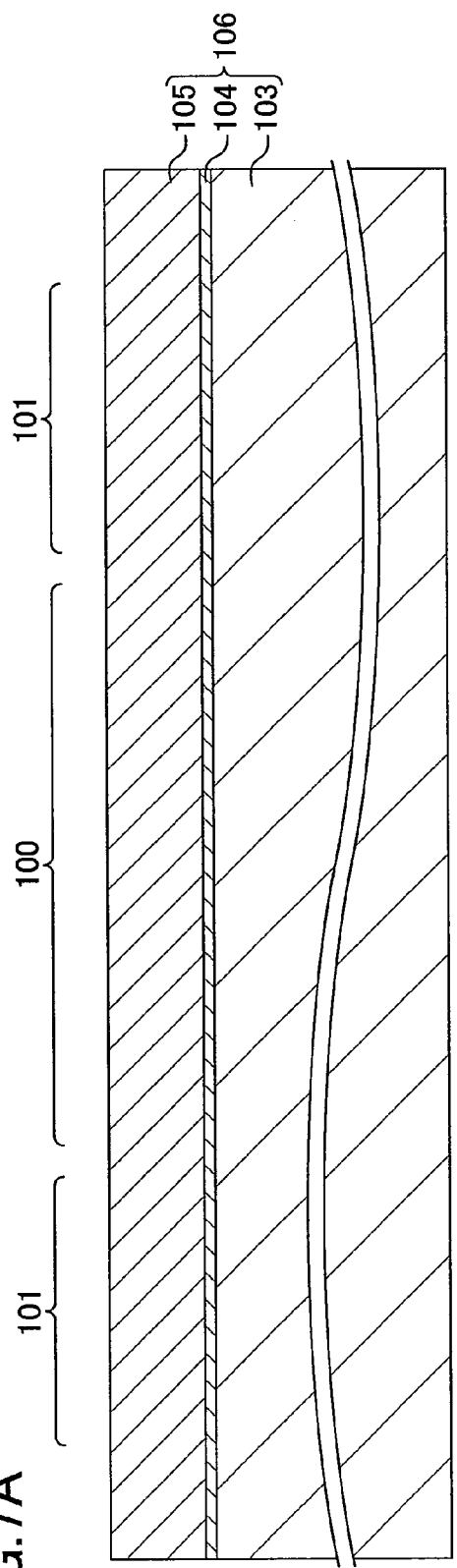
FIGS. 7A and 7B are sectional views showing a solid-state imaging element manufacturing method in accordance with the present invention.

First, as shown in FIG. 7A, the P$^+$-type layer 104 having a high P-type impurity concentration in the range between $1 \times 10^{18}$ atoms/cm$^3$ and $1 \times 10^{21}$ atoms/cm$^3$, both inclusive, and the N-type layer 105 having a low N-type impurity concentration in the region between $1 \times 10^{14}$ atoms/cm$^3$ and $1 \times 10^{15}$ atoms/cm$^3$, both inclusive, are epitaxially grown by CVD or the like on the N-type silicon substrate 103 sequentially to form the NP$^+$N-type layered substrate 106. The thickness of the P$^+$-type layer 104 is set in the range between approximately 0.1 μm and 1 μm, both inclusive while that of the N-type layer 105 is set in the range between approximately 5 μm and 7 μm, both inclusive. None of the effects of the present invention are lost even if the N-type silicon substrate 103 is replaced by a P-type substrate at a low impurity concentration.

Figure 7B:
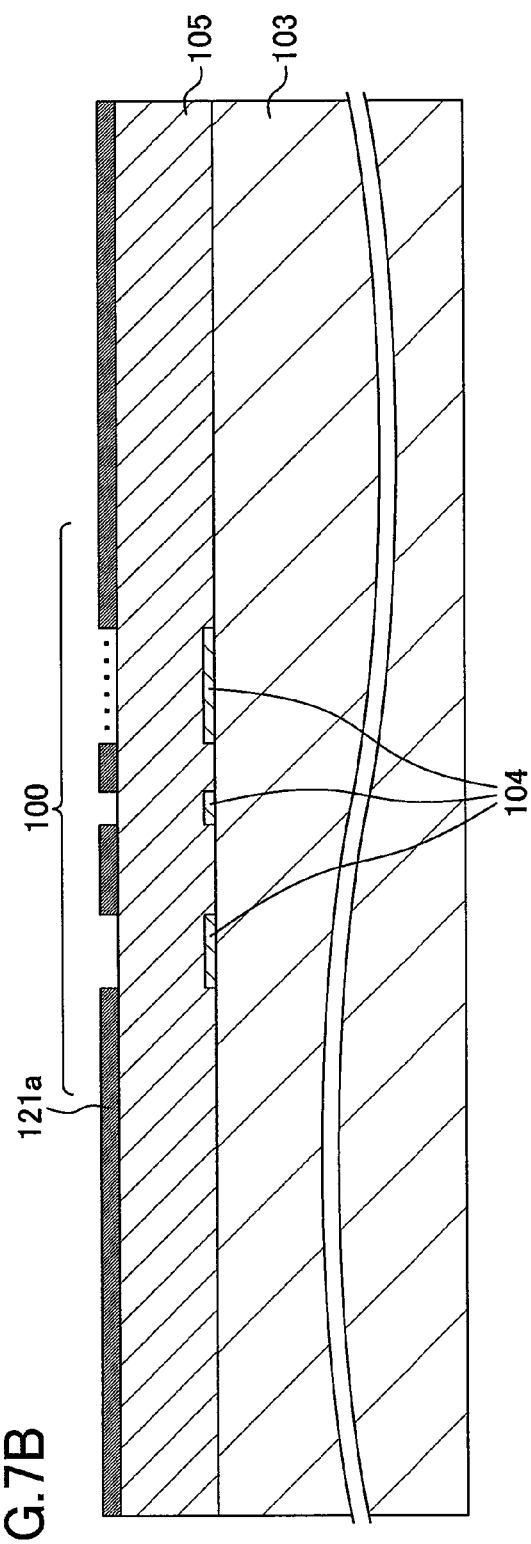

Herein, as shown in FIG. 7B, the P-type layer 104 may be formed by ion implantation. To do so, a resist film 121a is applied on the entirety of the obverse face first; resist patterning is performed to open only the PN photodiode 109 formation region in the imaging region 100, and then, a P-type impurity ion is implanted in the N-type silicon substrate 103 with the use of the resist film 121a as a mask to form a part of the P$^+$-type layer 104 having a peak concentration in the range between $1 \times 10^{18}$ atoms/cm$^3$ and $1 \times 10^{21}$ atoms/cm$^3$, both inclusive. Next, as shown in FIG. 8A, following removal of the resist film 121a, a resist film 121b is applied and patterning is performed to open a region other than the PN photodiode 109 formation region in the imaging region 100. Then, ion implantation is performed to form another part of the P$^+$-type layer 104 in a region other than the PN photodiode 109 formation region so that the peak point of the part of the P$^+$-type layer 104 in the region other than the PN photodiode 109 formation region is located deeper than that of the part of the P$^+$-type layer 104 in the PN photodiode 109 formation region. This means that the P$^+$-type layer 104 can be formed which has peak points at desired depths and locations. The P$^+$-type layer 104 may be formed by ion implantation in this way.

Subsequently, as shown in FIG. 8B, the silicon oxide film 114a having a thickness of approximately 1 to 50 nm as a pad insulating film and a silicon nitride film 120 having a thickness of approximately 50 to 400 nm and functioning as an oxidation resisting film are formed sequentially on the layered substrate 106 by known CVD or the like. Then, a resist film 121c is applied on the silicon nitride film 120, and resist patterning is performed.

Thereafter, as shown in FIG. 9A, a region in which the resist film 121c is opened is etched to remove the silicon oxide film 114a and the silicon nitride film 120 selectively for forming an opening, and then, the resist film 121c is removed. The size of this opening depends on the design value of the pixel size. The silicon nitride film 120 is used as a hard mask in the above exemplified method, but the silicon oxide film 114a may be used as the hard mask.

Next, as shown in FIG. 9B, a trench is formed by etching the N-type layer 105 for forming the isolation region 111. The depth of the trench is set to the extent that the active region and the PN photodiode 109 can be separated electrically from each other. In this example, the depth thereof is approximately 150 to 300 nm from the obverse face of the layered substrate 106 (the N-type layer 105). Then, a P-type impurity ion is implanted with the use of another mask in which an opening is formed correspondingly to the imaging region 100 with the peripheral circuit region 101 covered to form a P-type layer containing the P-type impurity at a high concentration in the side wall of the trench in the imaging region 100.

Figure 10A:
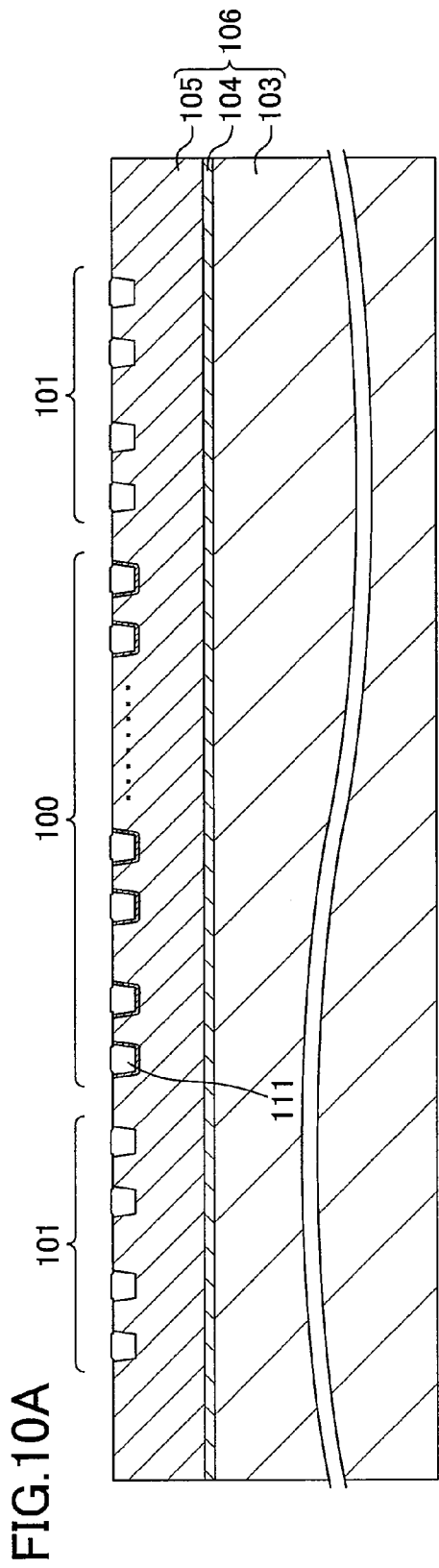
FIGS. 10A and 10B are sectional views showing the solid-state imaging element manufacturing method in accordance with the present invention.

Subsequently, as shown in FIG. 10A, the trench is filled with a silicon oxide film, the surface of the thus filled silicon oxide film is planarized by CMP, and then, the silicon nitride film 120 is removed to thus form the isolation region 111.

Figure 10B:
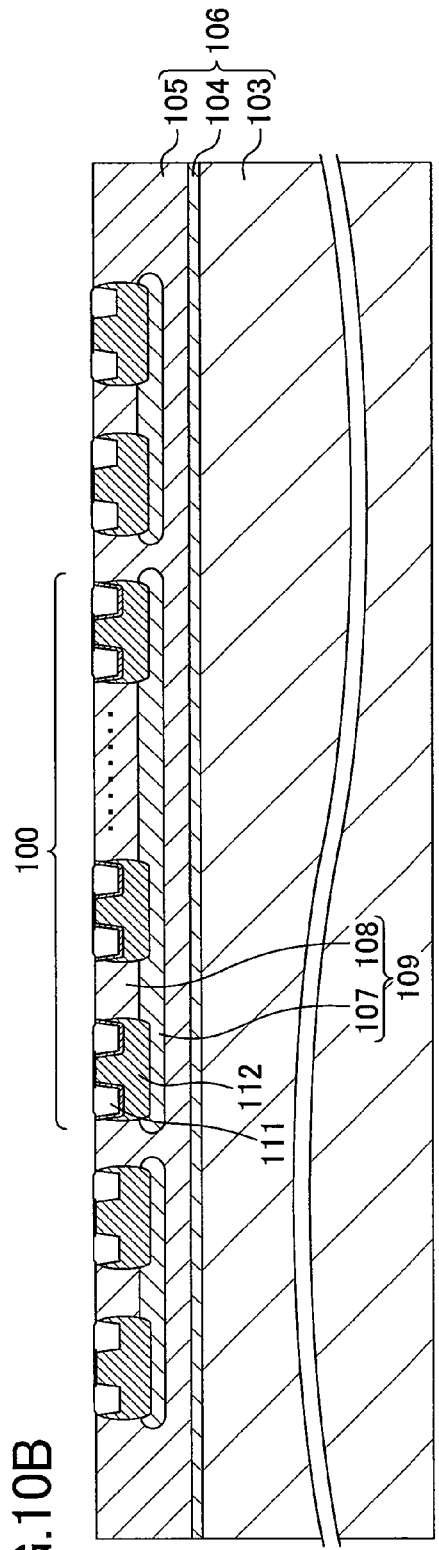

Thereafter, as shown in FIG. 10B, the P-type impurity layer 107, the N-type impurity layer 108, and the P-type channel stop layer 112 are formed sequentially by ion implantation to the N-type layer 105, thereby forming the PN photodiode 109 including the P-type impurity layer 107 and the N-type impurity layer 108. The channel stopper layer 112 is formed for preventing leakage current of the MOS transistors formed thereafter and preventing conduction between the N-type impurity layers 108 of adjacent pixels.

Next, as shown in FIG. 11A, the gate electrode 113a is formed on the gate insulating film in the imaging region 100 while the gate electrode 113b is formed on the gate insulating film in the peripheral circuit region 101, and then, an impurity diffusion layer functioning as source/drain regions is formed by ion implantation, and so on to thus form the MOS transistors. Herein, the MOS transistors formed in the peripheral circuit region 101 compose the vertical shift resister 101b, the horizontal shift resistor 101a, and the like (see FIG. 1) while the MOS transistors formed in the imaging region 100 function as a transfer transistor for transferring the charges accumulated in the PN photodiode 109 to the floating diffusion, the amplifier transistor for amplifying the charges transferred to the floating diffusion, the selector transistor controlled by the vertical shift resistor 101b for selecting a pixel, and the like. The gate insulating film is formed to have a desired thickness by thermal oxidation or the like after removal of the silicon oxide film 114a followed by formation of the PN photodiode 109 in the step shown in FIG. 10B.

Further, in the step shown in FIG. 11A, the P-type germanium silicon layer 119 having a thickness of approximately 50 to 1000 nm may be formed epitaxially only on the PN photodiode 109, namely, above the P-type impurity layer 107 in the imaging region 100, as shown in FIG. 11B. Silicon germanium has an absorption coefficient higher than silicon. Accordingly, formation of the silicon germanium layer 119 improves the sensitivity of the solid-state imaging element. Further, silicon germanium can absorb light having a wavelength of 1100 nm or longer, which silicon hardly absorbs, thereby contributing to a significant increase in sensitivity to the light.

Figure 12A:
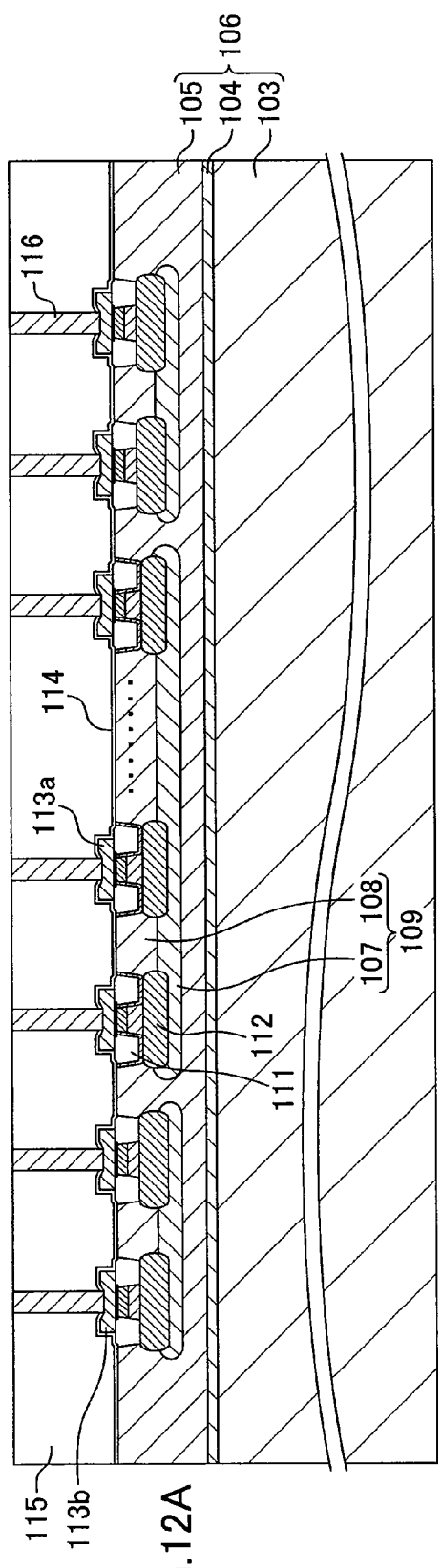
FIGS. 12A and 12B are sectional views showing the solid-state imaging element manufacturing method in accordance with the present invention.
Figure 12B:
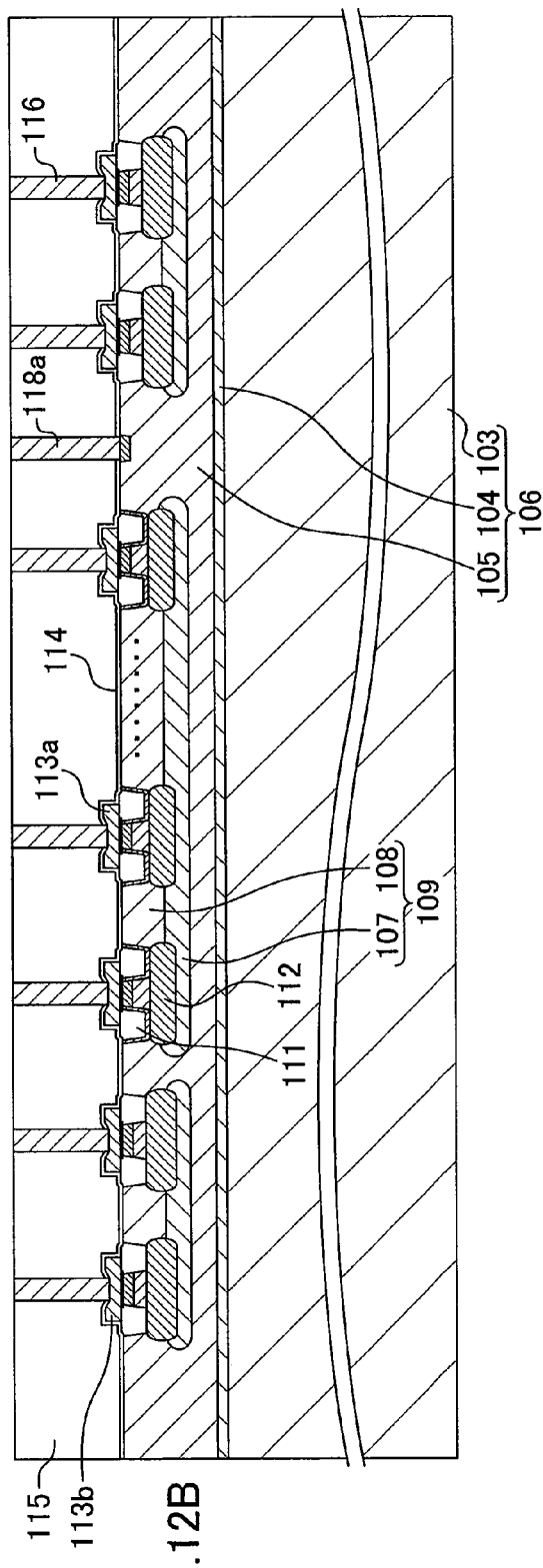

Subsequently, as shown in FIG. 12A, fowling formation of the silicon oxide film 114 and the interlayer insulating film 115 on the entire face of the layered substrate 106, a resist film (not shown) is applied and resist patterning is performed with the use of the resist film as a mask to form the contact plug 116. Herein, the substrate contact 118a to be connected to the N-type layer 105 may be formed around the imaging region 100 concurrently with the formation of the contact plug 116, as shown in FIG. 12B. Formation of the substrate contact 118a to be connected to the N-type layer 105 enables control on the potential of the N-type layer 105, leading to recovering of the charges photo-electrically converted in a part of the N-type layer 105 which is provided in the imaging region 100 to thus suppress color mixture.

Figure 13:
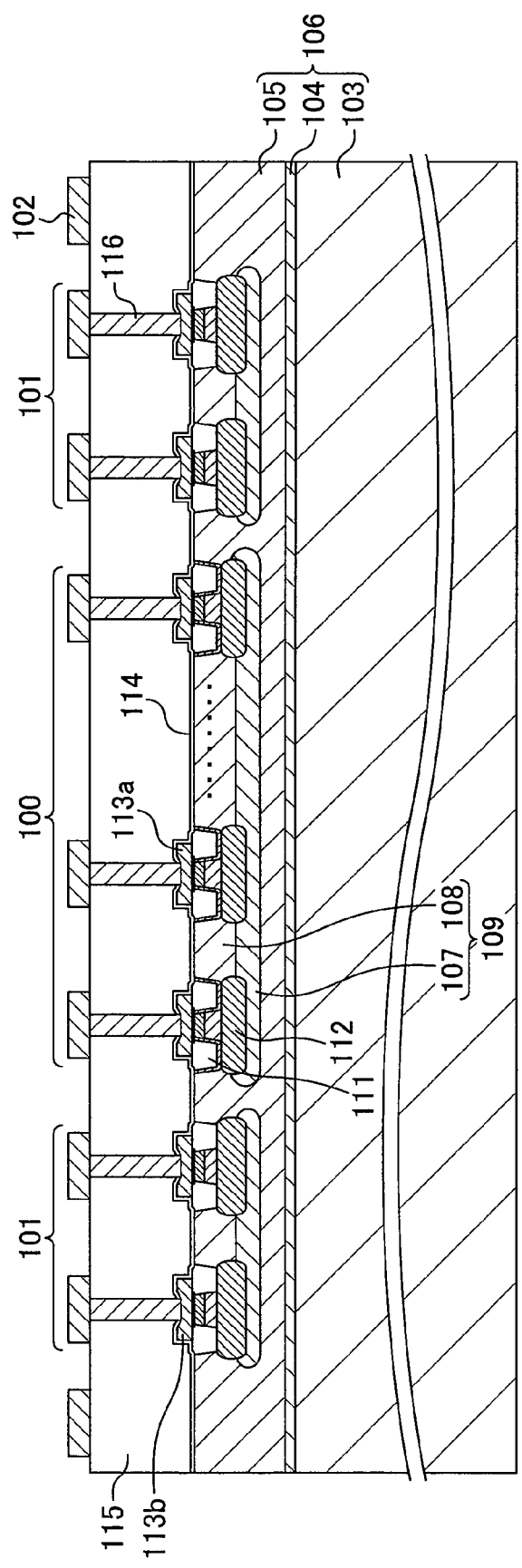
FIG. 13 is a sectional view showing the solid-state imaging element manufacturing method in accordance with the present invention.

Finally, as shown in FIG. 13, the wirings and the bonding pads 102 are formed on the interlayer insulating film 115.

Next, the reverse face of the layered substrate 106 of the solid-state imaging element formed through the above steps is processed to complete the resonance type solid-state imaging element. The further steps of the resonance type solid-state imaging element manufacturing method will be described with reference to FIGS. 14A, 14B, 15A, 15B, and 16.

As shown in FIG. 14A, a silicon oxide film 214 having a thickness of approximately 200 to 500 nm is formed as an insulating film on the entirety (the obverse face, the side faces, and the reverse face) of the thus formed solid-state imaging element. The silicon oxide film 214 may be replaced by a silicon nitride film. Then, as shown in FIG. 14B, a resist film is applied on the reverse face of the N-type silicon substrate 103, resist patterning is performed with the use of a double-sided aligner for removing a part of the silicon oxide film 214 to expose only the reverse face of the layered substrate 106 in the imaging region 100. Then, the resist film is removed.

Next, as shown in FIG. 15A, anisotropic etching is performed on the reverse face of the layered substrate 106 with the use of TMAH (tetramethyl ammonium hydroxide) to form the recess 122. This step is performed with the concentration of the TMAH set in the range between 10% and 30%, both inclusive, at a temperature in the range between 70° C. and 90° C. In the manufacturing method of the present embodiment, the orientation of the crystal plane of the layered substrate 106 is not limited specifically. When the face of the layered substrate 106 on which an imaging element is formed is (100) oriented, anisotropic etching proceeds to expose the (111)-oriented plane, thereby forming the tapered face (approximately 55 degrees) as shown in the drawings. On the other hand, when the obverse face of the layered substrate 106 is (110) oriented, vertical etching proceeds to form no tapered face. Since TMAH has a low etching rate to silicon (1000 times or more though it depends on the temperature and the concentration of TMAH), the silicon oxide film 114 can be used as a hard mask for this etching. Further, as indicated in "Boron Etch-stop in TMAH Solutions"; Elin Steinsland, Martin Nese, Anders Hanneborg, Ralph W. Bernstein, Halle Sandmo, and Gjermund Kittilsland, The $8^{th}$ International Conference on Solid-State Sensors and Actuators, and Eurosensors, IX. 40-PA 4, Jun. 25-29, 1995, the etching rate of TMAH is lower in a high boron concentration region of which impurity concentration is in the range between $1\times10^{18}$ atoms/cm$^3$ and $1\times10^{21}$ atoms/cm$^3$, both inclusive, than in a low boron concentration region of which impurity concentration is equal to or higher than $1\times10^{14}$ atoms/cm$^3$ and lower than $1\times10^{18}$ atoms/cm$^3$, and accordingly, the P$^+$-type layer 104 can be used as an etching stopper layer. In a case of a device free from influence of alkaline ion, anisotropic etching using KOH can obtain just the same effects as those in the present invention.

Figure 16:
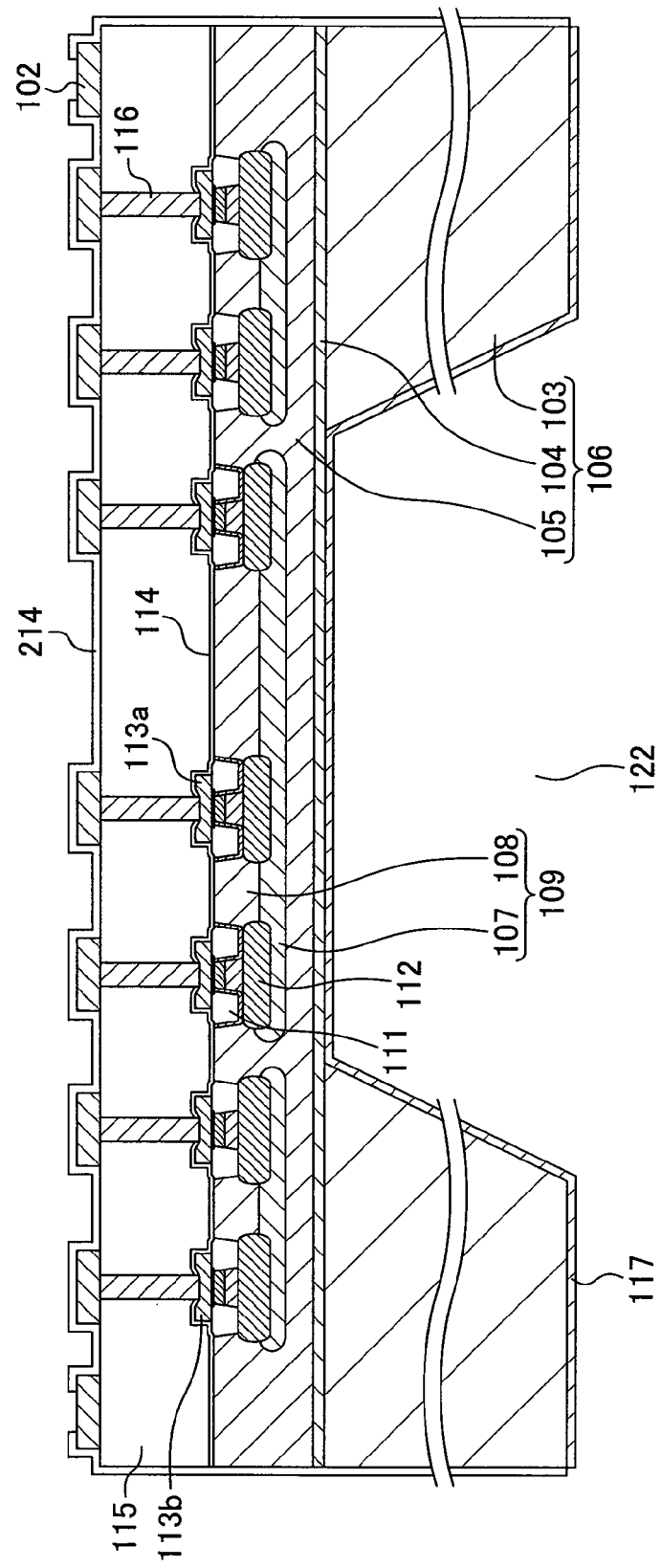
FIG. 16 is a sectional view showing the solid-state imaging element manufacturing method in accordance with the present invention.

Subsequently, as shown in FIG. 15B, after a resist film is applied on the surface of the substrate, parts of the resist film which are located on the bonding pads 102 are opened. Then, the silicon oxide film 214 is etched with the use of the resist film to form openings above the bonding pads 102. Finally, as shown in FIG. 16, the silicon oxide film 214 on the reverse face of the substrate is removed, the reflective film 117 is formed on the entirety of the reverse face of the layered substrate 106 by depositing a metal film having a high reflectance, such as Au, Ag, Al, or the like. Alternatively, the reflective film 117 made of a dielectric or organic material may be formed. Formation of the reflective film 117 on at least the inner face of the recess 122 rather than the entirety of the reverse face of the layered substrate 106 can improve the sensitivity of the solid-state imaging element, as well. The remaining silicon oxide film 214 may be removed thereafter, as shown in FIG. 2.

In this way, employment of a material having a high reflectance increases the quantum efficiency to attain a resonance type solid-state imaging element exhibiting high sensitivity.

Embodiment 7

Figure 17:
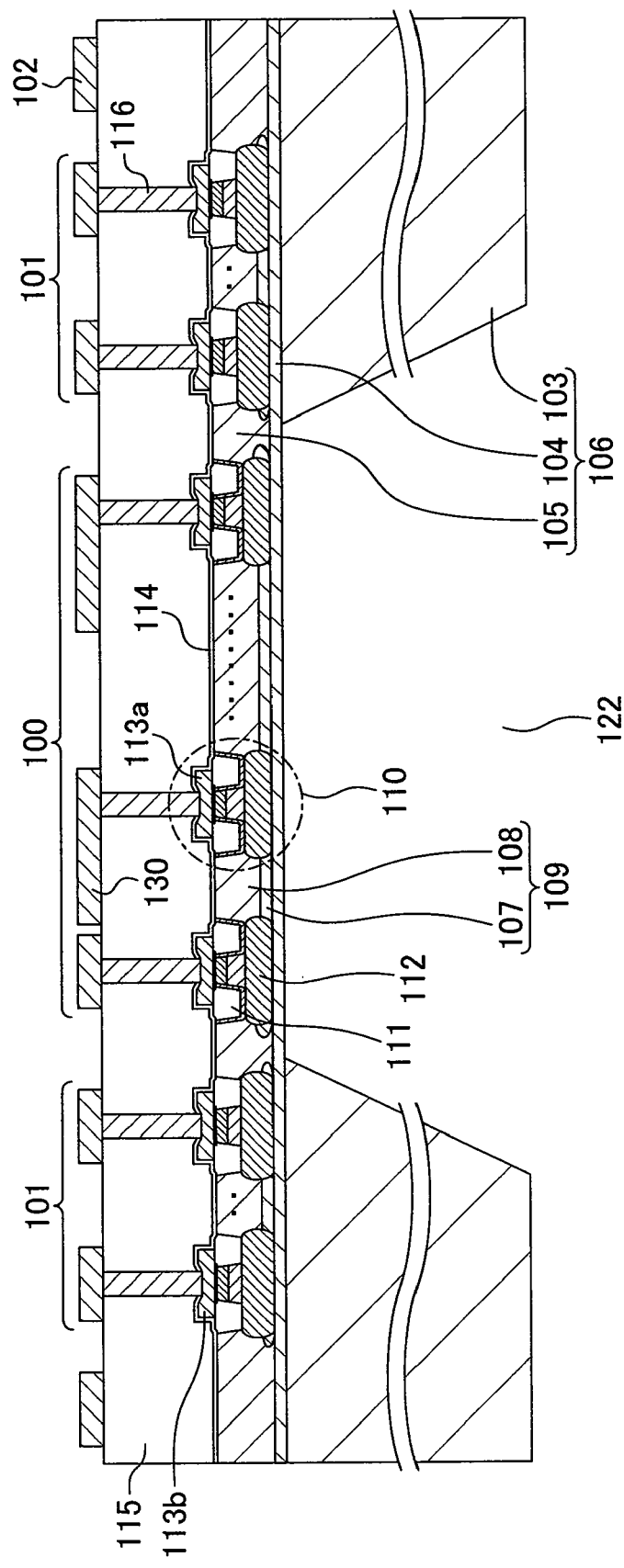
FIG. 17 is a sectional view showing an example of a structure of a solid-state imaging element in accordance with Embodiment 7 of the present invention.
Figure 18:
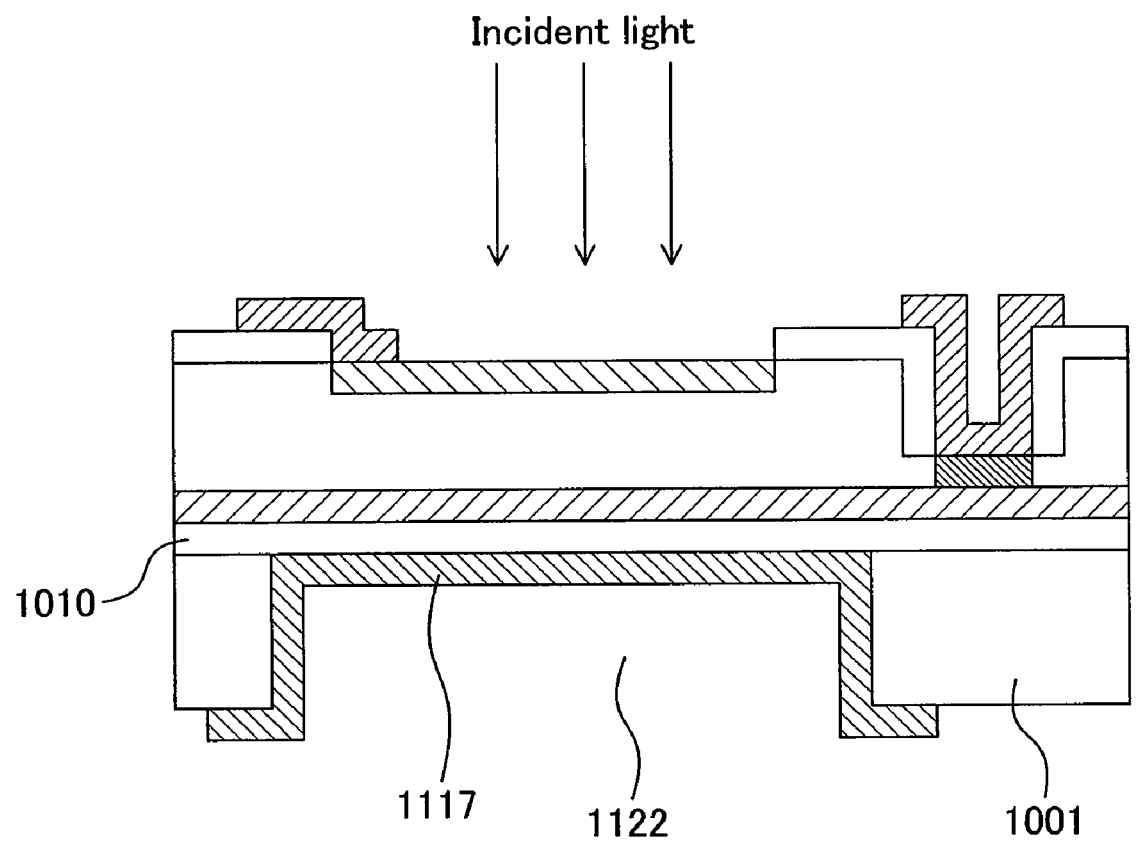
FIG. 18 is a sectional view showing a conventional resonance type light receiving device.

FIG. 17 is a sectional view showing an example of a structure of a solid-state imaging element in accordance with Embodiment 7 of the present invention.

The solid-state imaging element of the present embodiment has a structure of the solid-state imaging element in accordance with Embodiment 1 (see FIG. 2), wherein the P-type impurity layer 107 composing the PN photodiode 109 is formed so as to be in contact at the bottom thereof with the P$^+$-type layer 104, and a wiring 130 is formed on the interlayer insulating film 115 so as to cover the PN photodiode 109 in a plan view, as shown in FIG. 17. Herein, it is preferable that the thickness of the P$^+$-type layer 104 after being used as the etching stepper for forming the recess 122 is in the range between approximately 1 nm and 50 nm, both inclusive, for example.

In the solid-state imaging element of the present embodiment, the P-type impurity layer 107 composing the PN photodiode 109 is formed so as to overlie the P$^+$-type layer 104, and the wiring 130 is formed on the interlayer insulating film 115 so as to cover a region where the PN photodiode 109 is formed. Accordingly, the imaging element operates as an image sensor of reverse-face irradiation type in which light is made incident from the reverse face of the layered substrate 106. In the solid-state imaging element of the present embodiment, light made incident from the reverse face of the layered substrate 106 is photo-electrically converted by the PN photodiode 109 while light transmitted through the PN photodiode 109 is reflected on the wiring 130 formed so as to cover the region where the PN photodiode 109 is formed and is then photo-electrically converted in the PN photodiode 109. Accordingly, the solid-state imaging element of the present embodiment exhibits improved sensitivity. Herein, in the case where the thickness of the P$^+$-type layer 104 serving as an etching stopper in forming the recess 122 is in the range between approximately 1 nm and 50 nm, both inclusive, sufficient sensitivity can be maintained with no lowering in sensitivity to light having a wavelength of which absorption length is short invited.

Heretofore, the embodiments of the present invention have been described. These are mere examples of the present invention and the present invention is not limited thereto. Various design variations and replacement of members are possible within the scope not deviating from the subject matter of the present invention.

As described above, the present invention is useful in realization of resonance type solid-state imaging elements used for night security, safety driving assistance, and the like.

What is claimed is:

1. A solid-state imaging element in which an imaging region in which a plurality of pixels each including a photoelectric converter and a transistor are provided and a peripheral circuit region are formed, comprising:
   a substrate including a silicon substrate and a first semiconductor layer containing a P-type impurity at a concentration higher than that in the silicon substrate and having an obverse face on which the plurality of pixels are provided and a reverse face portion,
   wherein a recess reaching the reverse face of the first semiconductor layer is formed in the reverse face portion of the substrate in the imaging region.

2. The solid-state imaging element of claim 1, wherein the substrate further includes a second semiconductor layer provided on the first semiconductor layer.

3. The solid-state imaging element of claim 2, wherein the first semiconductor layer and the second semiconductor layer are formed by epitaxial growth.

4. The solid-state imaging element of claim 1, wherein the first semiconductor layer is formed by ion implantation to form an impurity concentration peak, and
   a part under the photoelectric converter which forms the impurity concentration peak is located shallower than a part under the transistor which forms the impurity concentration.

5. The solid-state imaging element of claim 1, further comprising:
   a light reflective film formed on an inner face of the recess.

6. The solid-state imaging element of claim 1, further comprising:
   in the peripheral circuit region, a substrate contact part including a substrate contact provided on the substrate and a pad connected to the substrate contact.

7. The solid-state imaging element of claim 1, further comprising:
   a silicon germanium layer formed on a region of the substrate in which the photoelectric converter is formed and having the same conductivity as the first semiconductor layer.

8. The solid-state imaging element of claim 2, wherein a total thickness of the first semiconductor layer and the second semiconductor layer in a region where the recess is formed is in a range between 5 μm and 8 μm, both inclusive.

9. The solid-state imaging element of claim 1, further comprising:
   a wiring over the photoelectric converter,
   wherein the first semiconductor layer is in contact with the bottom of the photoelectric converter.

10. The solid-state imaging element of claim 1, wherein the first semiconductor layer has an impurity concentration in a range between $1\times10^{18}$ atoms/cm$^3$ and $1\times10^{21}$ atoms/cm$^3$, both inclusive.

11. The solid-state imaging element of claim 5, wherein the light reflective film is made of a metal material, a dielectric material, or an organic material.

* * * * *